US007214469B2

(12) United States Patent
Yamasaki

(10) Patent No.: US 7,214,469 B2

(45) Date of Patent: May 8, 2007

(54) LITHOGRAPHIC PRINTING PLATE PRECURSOR AND LITHOGRAPHIC PRINTING METHOD

(75) Inventor: Sumiaki Yamasaki, Shizuoka (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 11/017,835

(22) Filed: Dec. 22, 2004

(65) Prior Publication Data

US 2005/0142483 A1 Jun. 30, 2005

(30) Foreign Application Priority Data

Dec. 26, 2003 (JP) .......................... P.2003-432322
Jan. 19, 2004 (JP) .......................... P.2004-010320

(51) Int. Cl.

| | |
|---|---|
| ***G03F 7/032*** | (2006.01) |
| ***G03F 7/038*** | (2006.01) |
| ***G03F 7/20*** | (2006.01) |
| ***G03F 7/30*** | (2006.01) |
| ***B41N 1/08*** | (2006.01) |
| ***G03C 1/77*** | (2006.01) |

(52) U.S. Cl. ............................... 430/271.1; 430/275.1; 430/277.1; 430/278.1; 430/279.1; 430/302; 430/944; 101/456; 101/454; 101/453; 101/457; 101/450.1; 101/451; 101/465; 101/467

(58) Field of Classification Search ............. 430/271.1, 430/302, 270.1, 944, 281.1
See application file for complete search history.

(56) References Cited

U.S. PATENT DOCUMENTS

2002/0177074 A1 11/2002 Hoshi et al.
2003/0064318 A1 4/2003 Huang et al. ............ 430/270.1
2003/0164105 A1* 9/2003 Tashiro ....................... 101/453

FOREIGN PATENT DOCUMENTS

| | | | | |
|---|---|---|---|---|
| EP | 1 172 696 | A1 * | 1/2002 |
| JP | 2938397 | B2 | 6/1999 |
| JP | 2001-277740 | A | 10/2001 |
| JP | 2001-277742 | A | 10/2001 |
| JP | 2002-287334 | A | 10/2002 |
| JP | 2003-1957 | * | 1/2003 |
| WO | WO-02/082180 | A1 | 10/2002 |
| WO | WO-02/082183 | A1 | 10/2002 |
| WO | WO-2004/101280 | A1 | 11/2004 |

OTHER PUBLICATIONS

Machine-assisted English translation of JP 2003-001957, provided by JPO.*

* cited by examiner

*Primary Examiner*—Sin Lee
(74) *Attorney, Agent, or Firm*—Birch, Stewart, Kolasch & Birch, LLP

(57) ABSTRACT

The present invention provides a lithographic printing plate precursor and a lithographic printing method using the lithographic printing plate precursor, which is capable of an image recording by infrared laser scanning and an on-press development and excellent in fine line reproducibility and press life while maintaining good on-press developing properties, the lithographic printing plate precursor comprising: a support; and an image recording layer capable of being removed by a printing ink and/or a fountain solution, in which the image recording layer comprises an infrared absorber and a graft polymer having a specific graft chain.

9 Claims, No Drawings

LITHOGRAPHIC PRINTING PLATE PRECURSOR AND LITHOGRAPHIC PRINTING METHOD

BACKGROUND OF THE INVENTION

1. Field of the Invention

The present invention relates to a lithographic printing plate precursor and a lithographic printing method using the same. Specifically, the invention relates to a lithographic printing plate precursor capable of direct plate-making by scanning with infrared laser beams on the basis of digital signals of, e.g., a computer, i.e., a so-called direct plate-making lithographic printing plate precursor, and also relates to a lithographic printing method of directly developing the lithographic printing plate precursor on a printing press and performing printing without going through development process.

2. Background Art

A lithographic printing plate generally comprises a lipophilic image area that receives ink and a hydrophilic non-image area that receives a fountain solution in printing. Lithographic printing is a printing method of making difference in ink-adhering property on the surface of a lithographic printing plate with the lipophilic image area of the lithographic printing plate as the ink-receptive area and the hydrophilic non-image area as the fountain solution-receptive area (ink-repellent area) by making use of the natures of water and oil ink of repelling to each other, adhering ink only on the image area, and transferring the ink to the material to be printed, e.g., paper.

For manufacturing this lithographic printing plate, a lithographic printing plate precursor (a PS plate) comprising a hydrophilic support having provided thereon a lipophilic photosensitive resin layer (an image-recording layer) has so far been widely used. The lithographic printing plate is generally obtained by a plate-making method of exposing a lithographic printing plate precursor through an original image of a lith film and the like, and then, for leaving the image-recording layer of the image area behind, dissolving and removing the image-recording layer of the non-image area with an alkali developing solution or an organic solvent, to thereby bare a hydrophilic support surface.

In a conventional plate-making process of a lithographic printing plate precursor, a process of dissolving and removing a non-image area with a developing solution and the like corresponding to the image-recording layer after exposure is necessary, but the exclusion or simplification of such an additional wet process is one of the objects in the industry. Since the discard of waste solutions discharged with wet processes is a particularly great interest in the industry at large in recent years from the consideration of the global environment, the solution of the above problem is increasingly desired.

Concerning this requirement, as a simple plate-making method, a method that is called on-press development is proposed, which is a method of using an image-recording layer capable of being removed a non-image area of a lithographic printing plate precursor in an ordinary printing process, and removing a non-image area after exposure on a printing press to obtain a lithographic printing plate.

As the specific examples of on-press development, e.g., a method of using a lithographic printing plate precursor having an image-recording layer soluble or dispersible with, e.g., a fountain solution, an ink solvent, or an emulsified product of a fountain solution and ink, a method of mechanically removing an image-recording layer by the contact with the rollers and the blanket of a press, and a method of mechanically removing an image-recording layer by the contact with the rollers and the blanket after weakening the cohesive strength of the image-recording layer or the adhesive strength of the image-recording layer and a support by the permeation of a fountain solution and an ink solvent are exemplified.

In the present invention, unless otherwise indicated, "development process" means a process of removing the area of an image-recording layer of a lithographic printing plate precursor not irradiated with an infrared laser by being brought into contact with a liquid (generally an alkali developing solution) to thereby bare the hydrophilic support surface with an apparatus other than a printing press (an automatic processor, in general), and "on-press development" means a method and a process of removing the area of an image-recording layer of a lithographic printing plate precursor not irradiated with an infrared laser by being brought into contact with a liquid (generally printing ink and/or a fountain solution) to thereby bare the hydrophilic support surface with a printing press.

However, when a conventional image-recording layer of an image-recording system utilizing ultraviolet rays and visible rays is used, it is necessary to take methods requiring much labor, such that the exposed lithographic printing plate precursor must be stored under a completely light-shielding condition or a constant temperature condition until it is mounted on a printing press, since the image-recording layer is not fixed after exposure.

On the other hand, in recent years, digitized techniques of electronically processing, accumulating and outputting image data using a computer have prevailed, and various image output systems corresponding to these digitized techniques have been put to practical use. Under such circumstances, a computer-to-plate technique of directly making a printing plate is attracting public attention, which comprises scanning exposing a lithographic printing plate precursor with high convergent radiant rays such as laser beams carrying digitized image data without using a lith film, With such a tendency, it is an important technical subject to obtain a lithographic printing plate precursor well adapted to this purpose.

Accordingly, in recent years, the simplification of plate-making operation, and the realization of dry system and non-processing system have been more and more strongly required from both aspects of the above-described global environmental protection and the adaptation for digitization.

Since high output lasers such as semiconductor lasers and YAG lasers radiating infrared rays of the wavelength of from 760 to 1,200 nm are inexpensively available nowadays, methods of using these high output lasers as the image recording means are now promising as the manufacturing method of a lithographic printing plate by scanning exposure that is easy to be integrated in digitized techniques.

In conventional plate-making methods, a photosensitive lithographic printing plate precursor is imagewise exposed by low to middle intensity of illumination, and image recording is performed by the imagewise changes of physical properties by photochemical reaction in the image-recording layer. While in the above method of using high output lasers, an exposure area is irradiated with a great quantity of light energy in an extremely short period of time to efficiently convert the light energy to heat energy, the heat energy is used to cause heat changes such as chemical changes, phase changes and morphological or structural changes in the image-recording layer, and these changes are utilized in image recording. Accordingly, image data are inputted by light energy, e.g., laser beams, but image recording is performed in the state including the reaction by heat energy in addition to light energy. A recording system making use of beat generation by such high power density exposure is generally called heat mode recording, and converting light energy to heat energy is called light/heat conversion.

Great advantages of the plate-mating method using beat mode recording are that image-recording layers are photoinsensitive to the lights of ordinary levels of illuminance such as room illumination, and that the fixation of images recorded by high illuminance exposure is not necessary. That is, lithographic printing plate precursors for use in heat mode recording are free of sensitization by room illumination before exposure and the fixation of images is not essential after exposure. Accordingly, a printing system that an image is not influenced even if exposed to room light after exposure becomes possible by using, e.g., an image-recording layer which is solubilized or insolubilized by exposure with high output laser beams and performing plate-making process by on-press development to make an exposed image-recording layer to an imagewise lithographic printing plate. Therefore, it is expected that a lithographic printing plate precursor preferably used for on-press development will be possible to be obtained if heat mode recording is used.

As one example concerning this mode, a lithographic printing plate precursor comprising a hydrophilic support having provided thereon an image-forming layer containing hydrophobic thermoplastic polymer particles dispersed in a hydrophilic binder is disclosed in patent literature 1 (Japanese Patent 2938397). The patent literature 1 discloses that it is possible to perform on-press development with a fountain solution and/or ink by subjecting the lithographic printing plate precursor to exposure with infrared laser beams to coalesce the hydrophobic thermoplastic polymer particles by beat to thereby form an image, and then mounting the lithographic printing plate precursor on the cylinder of a printing press.

However, although a method of forming an image by coalescence of fine particles by mere heat fusion as above certainly shows good on-press developing properties, there are problems that image strength (the adhesion of an image-forming layer and a support) is extremely weak and press life is insufficient.

Further, lithographic printing plate precursors having an image-recording layer (a heat-sensitive layer) containing microcapsules encapsulating a polymerizable compound on a hydrophilic support are disclosed in patent literature 2 (JP-A-2001-277740 (The term "JP-A" as used herein refers to an "unexamined published Japanese patent application".)) and patent literature 3 (JP-A-2001-277742).

Further, patent literature 4 (JP-A-2002-287334) discloses a lithographic printing plate precursor comprising a support having provided thereon an image-recording layer (a heat-sensitive layer) containing an infrared absorber, a radical polymerization initiator and a polymerizable compound.

These methods of using a polymerization reaction are characterized in that relatively high image strength can be obtained, since chemical bonding density of an image area is high as compared with an image area formed by coalescence of polymer fine particles. However, from the practical point of view, any of on-press developing properties, fine line reproducibility and press life is insufficient and these systems have not been put to practical use yet.

Further, a lithographic printing plate precursor capable of on-press development comprising a support having thereon an image-recording layer containing a polymerizable compound, a graft polymer having polyethylene oxide chains on the side chain or a block polymer having a polyethylene oxide block is disclosed in patent literature 5 (U.S. patent application publication 2003/0,064,318).

However, according to this technique, good on-press developing properties can be obtained but fine line reproducibility and press life are still insufficient.

SUMMARY OF THE INVENTION

The present invention has been achieved for the purpose of improving the prior art drawbacks. That is, an object of the invention is to provide a lithographic printing plate precursor capable of image recording by infrared laser scanning and on-press development, and excellent in fine line reproducibility and press life while maintaining good on-press developing properties, and another object is to provide a lithographic printing method using the lithographic printing plate precursor.

The present invention is as follows.

1. A lithographic printing plate precursor comprising: a support; and an image recording layer capable of being removed by a printing ink and/or a fountain solution, in which the image recording layer comprises an infrared absorber and a graft polymer having a graft chain containing a hydrophilic segment, wherein the hydrophilic segment is a polymer containing at least one monomer unit selected from the group consisting of an amido group-containing monomer, an acid group-containing monomer, an alkali metal salt of an acid group-containing monomer, a quaternary ammonium salt-containing monomer and a hydroxyl group-containing monomer in proportion of 50 mol % or more.

2. A lithographic printing plate precursor comprising: a support; and an image recording layer, wherein the image recording layer comprises an infrared absorber and a graft polymer having a hydrophilic main chain and a graft chain containing a hydrophobic segment.

3. The lithographic printing plate precursor as described in the item 1, wherein the image-recording layer contains a polymerization initiator and a polymerizable compound.

4. The lithographic printing plate precursor as described in the item 2, wherein the image-recording layer contains a polymerization initiator and a polymerizable compound.

5. The lithographic printing plate precursor as described in the item 2, wherein the image-recording layer is capable of being removed by a printing ink and/or a fountain solution, 6. A lithographic printing method, which comprises: mounting the lithographic printing plate precursor as described in the item 1 on a printing press; and then imagewise exposing the lithographic printing plate precursor with an infrared laser beam; providing the lithographic printing plate precursor with an oily ink and an aqueous component to remove the unexposed area with the infrared ray of the image recording layer, and performing a printing.

7. A lithographic printing method, which comprises: imagewise exposing the lithographic printing plate precursor as described in the item 1 with an infrared laser beam; and then mounting the lithographic printing plate precursor on a printing press; providing the lithographic printing plate precursor with an oily ink and an aqueous component to remove the unexposed area with the infrared ray of the image recording layer; and performing a printing.

8. A lithographic printing method, which comprises: mounting the lithographic printing plate precursor as described in the item 2 on a printing press; and then imagewise exposing the lithographic printing plate precursor with an infrared laser beam; providing the lithographic printing plate precursor with an oily ink and an aqueous component to remove the unexposed area with the infrared ray of the image recording layer; and performing a printing.

9. A lithographic printing method, which comprises; imagewise exposing the lithographic printing plate precursor as described in the item 2 with an infrared laser beam; and then mounting the lithographic printing plate precursor on a printing press; providing the lithographic printing plate precursor with an oily ink and an aqueous component to remove the unexposed area with the infrared ray of the image recording layer, and performing a printing.

The mechanism of the function of a graft polymer having a hydrophilic graft chain is not clear, but it is presumed that the hydroplilic area is localized in the image recording layer by the presence of the graft polymer, and water permeability increases by the localized hydrophilic area in the unexposed area of the image recording layer, which results in the improvement of on press developing properties, and water permeability is inhibited in the exposed area of the image recording layer, since the neighborhood of the hydrophilic area is also hardened by polymerization, as a result an on-press development type lithographic printing plate precursor can be obtained. It is thought that by using a hydrophilic graft chain having a high glass transition temperature, mechanical strength of the part corresponding to the skeleton of the hydrophilic area can be improved in the invention, as a result fine line reproducibility and press life which have so far been insufficient can be brought into a sufficient level while maintaining good on-press developing properties.

In addition, the mechanism of the function of a graft polymer having a hydrophilic main chain and a graft chain of a hydrophobic segment is not clear, but it is presumed that the hydrophilic area and the hydrophobic area are localized in the image recording layer by the presence of the graft polymer, and water permeability increases by the localized hydrophilic area in the unexposed area of the image recording layer, which results in the improvement of on-press developing properties, and water permeability is inhibited in the exposed area of the image recording layer, since the neighborhood of the hydrophilic area is also hardened by polymerization, as a result a good image is formed. Further, since the graft chain overwhelmingly predominant in the graft polymer are hydrophobic, the image hardened by polymerization in the vicinity have a sufficient water resisting property and mechanical strength, as a result, presumably fine line reproducibility and press life are excellent differently from the case of using a graft polymer having polyethylene oxide chains and a hydrophobic main chain as in patent literature 5.

The present invention can provide a lithographic printing plate precursor capable of image recording by infrared laser beams, and excellent in fine line reproducibility and press life while maintaining good on-press developing properties, and a lithographic printing method using the lithographic printing plate precursor.

DETAILED DESCRIPTION OF THE INVENTION

In the first embodiment, the lithographic printing plate precursor of the invention is a lithographic printing plate precursor capable of an image-recording by an infrared laser beam and an on-press development, which comprises a support and an image recording layer containing an infrared absorber and a graft polymer having a specific graft chain containing a hydrophilic segment.

In the second embodiment, the lithographic printing plate precursor of the invention is a lithographic printing plate precursor capable of an image-recording by an infrared laser beam and an on-press development, which comprises a support and an image recording layer containing an infrared absorber and a graft polymer having a hydrophilic main chain and a graft chain containing a hydrophobic segment.

The lithographic printing method of the invention is a method comprising:

mounting the lithographic printing plate precursor of the invention on a printing press and imagewise exposing it with an infrared laser beam, or imagewise exposing the lithographic printing plate precursor of the present invention with an infrared laser beam and then mounting it on a printing press;

providing the lithographic printing plate precursor with an oily ink and an aqueous component to remove the unexposed area with the infrared laser beam of the image recording layer; and performing printing.

The constitutional elements of the lithographic printing plate precursor and the printing method of the invention are described in detail below.

[Image Recording Layer]

The above first embodiment is described in the first place.

Graft Polymer Having a Graft Chain of Hydrophilic Segment:

In the first embodiment, the graft polymer is a graft polymer comprising a hydrophobic trunk having a graft chain of a hydrophilic segment as branches, and the hydrophilic segment is a polymer containing at least one hydrophilic monomer unit selected from an amido group-containing monomer, an acid group-containing monomer, an alkali metal salt of an acid group-containing monomer, a quaternary ammonium salt-containing monomer, and a hydroxyl group-containing monomer in proportion of 50 mol % or more. The hydrophilic segment preferably contains 70 mol % or more of the hydrophilic monomer unit.

The hydrophilic segment may be a polymer copolymerized with a hydrophobic monomer besides the hydrophilic monomer to adjust the degree of hydrophilicity. In that case, the proportion of the hydrophobic monomer in the hydrophilic segment is preferably less than 50 mol %, more preferably less than 30 mol %.

By using graft polymers having such a hydrophilic segment, a lithographic printing plate precursor excellent in fine line reproducibility and press life while maintaining good on-press developing properties can be obtained.

The synthesis of graft polymers is fundamentally classified to 1) a method of forming a branch monomer from a trunk polymer by polymerization, 2) a method of bonding a branch polymer to a trunk polymer, and 3) a method of copolymerizing a branch polymer to a trunk polymer (a macromer method).

The graft polymers for use in the invention can be synthesized by any of these three methods, but "3) a macromer method" is superior particularly for manufacturing aptitude and easiness of synthesis. The syntheses of graft polymers using macromers are described in compiled by Kobunshi Gakkai, *Shin Kobunshi Jikkengaku* 2, *Kobunshi no Gosei Hanno* (*The Study of New Polymer Experiment* 2, *Syntheses and Reactions of Polymers*), Kyoritsu Publishing Co. (1995), and also in detail in Yamashita et al., *Mac-*

*romonomer no Kagaku to Kogyo* (*Chemistry and Industry of Macromonomers*), IPC Co. (1989). In the first embodiment, the branch part of the graft polymer comprises a hydrophilic segment and the graft polymer can be easily obtained by copolymerization of a hydrophilic macromer and a hydrophobic monomer.

<Hydrophilic Macromer>

In the first embodiment, the hydrophilic segment of a hydrophilic macromer (also called a macro monomer) used is a polymer containing at least one monomer unit selected from an amido group-containing monomer, an acid group-containing monomer, an alkali metal salt of an acid group-containing monomer, a quaternary ammonium salt-containing monomer, and a hydroxyl group-containing monomer in proportion of 50 mol % or more.

The hydrophilic macromer used in the invention can be obtained by bonding a polymerizable group at the terminal of the hydrophilic segment.

As the specific examples of the amido group-containing monomers, t-butylsulfonic acid acrylamide, N,N-dimethylacrylamide, N,N-diethylacrylamide, N-isopropylacrylamide, acryloylmorpholine, methacrylamide, N-methylolacrylamide, N-vinylpyrrolidone, and N-vinylacetamide are exemplified.

As the specific examples of the acid group-containing monomers, methacrylic acid, acrylic acid and styrenesulfonic acid are exemplified. The specific examples of the alkali metal salts of an acid group-containing monomer include sodium methacrylate, sodium acrylate, sodium styrenesulfonate, sodium sulfonate ethoxymethacrylate, sodium sulfonate ethoxyacrylate, and sodium mono-2-acryloyloxyethyl acid phosphate.

As the specific examples of the quaternary ammonium salt-containing monomers, hydroxyethyltrimethylammonium chloride methacrylate, hydroxypropyltrimethylammonium chloride methacrylate, and hydroxyethyltrimethylammonium chloride acrylate are exemplified.

The specific examples of the hydroxyl group-containing monomers include 2-hydroxyethyl acrylate, 2-hydroxyethyl methacrylate, 3-hydroxypropyl acrylate, 3-hydroxypropyl methacrylate, and 2,3-dihydroxypropyl methacrylate.

As the hydrophobic monomers that are used for the adjustment of the hydrophilicity of hydrophilic segments, well-known hydrophobic monomers, e.g., acrylic esters, methacrylic esters, vinyl esters, styrenes, acrylonitrile, methacrylonitrile, maleic anhydride, and maleic acid imide are exemplified.

The specific examples of the acrylic esters include methyl acrylate, ethyl acrylate, (n- or i-)propyl acrylate, (n-, i-, sec- or t-)butyl acrylate, chloro ethyl acryl ate, cyclohexyl acrylate, allyl acrylate, benzyl acrylate, methoxybenzyl acrylate, chlorobenzyl acrylate, hydroxybenzyl acrylate, hydroxyphenethyl acrylate, dihydroxyphenethyl acrylate, furfuryl acrylate, tetrahydrofurfuryl acrylate, phenyl acrylate, hydroxyphenyl acrylate, chlorophenyl acrylate, sulfamoylphenyl acrylate, and 2-(hydroxyphenyl-carbonyloxy) ethyl acrylate.

The specific examples of the methacrylic esters include methyl methacrylate, ethyl methacrylate, (n- or i-)propyl methacrylate, (n-, i-, sec- or t-)butyl methacrylate, amyl methacrylate, 2-ethylhexyl methacrylate, chloroethyl methacrylate, cyclohexyl methacrylate, allyl methacrylate, benzyl methacrylate, methoxybenzyl methacrylate, chlorobenzyl methacrylate, hydroxybenzyl methacrylate, hydroxyphenethyl methacrylate, dihydroxyphenethyl methacrylate, furfuryl methacrylate, tetrahydrofurfuryl methacrylate, phenyl methacrylate, hydroxyphenyl methacrylate, chlorophenyl methacrylate, sulfamoylphenyl methacrylate, and 2-(hydroxyphenylcarbonyloxy)ethyl methacrylate.

The specific examples of the vinyl esters include vinyl acetate, vinyl butyrate and vinyl benzoate.

The specific examples of the styrenes include styrene, methylstyrene, dimethylstyrene, trimethylstyrene, ethyl-styrene, propylstyrene, cyclohexylstyrene, chloromethyl-styrene, trifluoromethylstyrene, ethoxymethylstyrene, acetoxymethylstyrene, methoxystyrene, dimethoxystyrene, chlorostyrene, dichlorostyrene, bromostyrene, iodostyrene, fluorostyrene and carboxystyrene.

The hydrophilic macromers preferably have a molecular weight of from 400 to 100,000, more preferably from 1,000 to 50,000, and particularly preferably from 1,500 to 20,000. In this range of the molecular weight, the effect of the invention can be exhibited without impairing the polymerizability with the copolymerizable monomers for forming trunks.

<Hydrophobic Monomer>

As the particularly useful hydrophobic monomers to be copolymerized with the hydrophilic macromers, well-known hydrophobic monomers, e.g., acrylic esters, methacrylic esters, vinyl esters, styrenes, acrylonitrile, methacrylonitrile, maleic anhydride, and maleic acid imide are exemplified. Graft polymers can be synthesized by arbitrarily selecting one or two or more monomers from the above monomers.

The specific examples of the acrylic esters include methyl acrylate, ethyl acrylate, (n- or i-)propyl acrylate, (n-, i-, sec- or t-)butyl acrylate, amyl acrylate, 2-ethylhexyl acrylate, dodecyl acrylate, chloroethyl acrylate, cyclohexyl acrylate, allyl acrylate, benzyl acrylate, methoxybenzyl acrylate, chlorobenzyl acrylate, hydroxybenzyl acrylate, hydroxyphenethyl acrylate, dihydroxyphenethyl acrylate, furfuryl acrylate, tetrahydrofurfuryl acrylate, phenyl acrylate, hydroxyphenyl acrylate, chlorophenyl acrylate, sulfamoylphenyl acrylate, and 2-(hydroxyphenylcarbonyloxy)-ethyl acrylate.

The specific examples of the methacrylic esters include methyl methacrylate, ethyl methacrylate, (n- or i-)propyl methacrylate, (n-, i-, sec- or t-)butyl methacrylate, amyl methacrylate, 2-ethylhexyl methacrylate, dodecyl methacrylate, chloroethyl methacrylate, cyclohexyl methacrylate, allyl methacrylate, benzyl methacrylate, methoxybenzyl methacrylate, chlorobenzyl methacrylate, hydroxybenzyl methacrylate, hydroxyphenethyl methacrylate, dihydroxyphenethyl methacrylate, furfuryl methacrylate, tetrahydrofurfuryl methacrylate, phenyl methacrylate, hydroxyphenyl methacrylate, chlorophenyl methacrylate, sulfamoylphenyl methacrylate, and 2-(hydroxyphenylcarbonyl-oxy)ethyl methacrylate.

The specific examples of the vinyl esters include vinyl acetate, vinyl butyrate and vinyl benzoate.

The specific examples of the styrenes include styrene, methylstyrene, dimethylstyrene, trimethylstyrene, ethyl-styrene, propylstyrene, cyclohexylstyrene, chloromethyl-styrene, trifluoromethylstyrene, ethoxymethylstyrene, acetoxymethylstyrene, methoxystyrene, dimethoxystyrene, chlorostyrene, dichlorostyrene, bromostyrene, iodostyrene, fluorostyrene and carboxystyrene.

The above hydrophobic monomers may further have a substituent. As the substituents, monovalent nonmetallic atomic groups exclusive of a hydrogen atom are used. The examples of preferred substituents include a halogen atom (—F, —Br, —Cl, —I), a hydroxyl group, an alkoxyl group, an aryloxy group, a mercapto group, an alkylthio group, an arylthio group, an alkyldithio group, an aryldithio group, an amino group, an N-alkylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, a ureido group, an N'-alkylureido group, an N',N'-dialkyl-ureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkyl-ureido group, an N',N'-dialkyl-N-aryl ureido group, an N'-aryl-N-alkylureido group, an N'-aryl-N-arylureido group, an N',N'-diaryl-N-alkylureido group, an N',N'-diaryl-N-aryl-ureido group, an N'-alkyl-N'-aryl-N-aklylureido group, an N'-alkyl-N'-aryl-N-arylureido group, an alkoxycarbonylamino group, an aryloxycarbonylainio group, an N-alkyl-N-alkoxy-carbonylamino group, an N-alkyl-N-aryloxycarbonylamino group, an N-aryl-N-alkoxycarbonylamino group, an N-aryl-N-aryloxy-carbonylamino group, a formyl group, an acyl group, a carboxyl group, an alkoxycarbonyl group, an aryloxycarbonyl group, a carbamoyl group, an N-alkylcarbamoyl group, an N,N-dialkyl-carbamoyl group, an N-arylcarbamoyl group, an N,N-diaryl-carbamoyl group, an N-alkyl-N-arylcarbamoyl group, an alky-sulfinyl group, an arylsulfinyl group, an alkylsulfonyl group, an arylsulfonyl group, a sulfo group ($—SO_3H$) and a conjugate base group thereof (hereinafter referred to as a sulfonato group), an alkoxysulfonyl group, an aryloxysulfonyl group, a sulfinamoyl group, an N-alkylsulfinamoyl group, an N,N-dialkylsulfinamoyl group, an N-arylsulfinamoyl group, an N,N-diaiylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, a phosphono group ($—PO_3H_2$) and a conjugate base group thereof (hereinafter referred to as a phosphonato group), a dialkyl-phosphono group ($—PO_3(alkyl)_2$), a diarylphosphono group ($—PO_3(aryl)_2$), an alkylarylphosphono group ($—PO_3(alkyl)-(aryl)$), a monoalkylphosphono group ($—PO_3H(alkyl)$) and a conjugate base group thereof (hereinafter referred to as an alkylphosphonato group), a monoarylphosphono group ($—PO_3H-(aryl)$) and a conjugate base group thereof (hereinafter referred to as an arylphosphonato group), a phosphonoxy group ($—OPO_3H_2$) and a conjugate base group thereof (hereinafter referred to as a phosphonatoxy group), a dialkylphosphonoxy group ($—OPO_3(alkyl)_2$), a diarylphosphonoxy group ($—OPO_3$-$(aryl)_2$), an alkylarylphosphonoxy group ($—OPO_3(alkyl)(aryl)$), a monoalkylphosphonoxy group ($—OPO_3H(alkyl)$) and a conjugate base group thereof. Hereinafter referred to as an alkylphosphonatoxy group), a monoarylphosphonoxy group ($—OPO_3H(aryl)$) and a conjugate base group thereof (hereinafter referred to as an arylphosphonatoxy group), a morpholino group, a cyano group, a nitro group, an aryl group, an alkenyl group, and an alkynyl group.

As the specific examples of the alkyl groups in these substituents, a methyl group, an ethyl group, a propyl group, a butyl group, a pentyl group, a hexyl group, a heptyl group, an octyl group, an isopropyl group, an isobutyl group, an s-butyl group, a t-butyl group, an isopentyl group, a neopentyl group, a 1-methylbutyl group, an isohexyl group, a 2-ethylhexyl group, a 2-methylhexyl group and a cyclopentyl group are exemplified. Of these groups, a hydrogen atom, a methyl group and an ethyl group are more preferred for their effects and easy availability. As the specific examples of the aryl groups, a phenyl group, a biphenyl group, a naphthyl group, a tolyl group, a xylyl group, a mesityl group, a cumenyl group, a chlorophenyl group, a bromophenyl group, a chloromethylphenyl group, a hydroxyphenyl group, a methoxyphenyl group, an ethoxyphenyl group, a phenoxyphenyl group, an acetoxyphenyl group, a benzoyloxyphenyl group, a methylthiophenyl group, a phenylthiophenyl group, a methylaminophenyl group, a dimethylaminophenyl group, an acetylaminophenyl group, a carboxyphenyl group, a methoxycarbonylphenyl group, an ethoxyphenylcarbonyl group, a phenoxycarbonylphenyl group, an N-phenylcarbamoylphenyl group, a phenyl group, a cyanophenyl group, a sulfophenyl group, a sulfonatophenyl group, a phosphonophenyl group and a phosphonatophenyl group are exemplified. As the examples of the alkenyl groups, a vinyl group, a 1-propenyl group, a 1-butenyl group, a cinnamyl group and a 2-chloro-1-ethenyl group are exemplified. As the examples of the alkynyl groups, an ethynyl group, a 1-propynyl group, a 1-butynyl group and a trimethylsilylethynyl group are exemplified. As $G_1$ in the acyl group ($G_1CO—$), a hydrogen atom and the above-described alkyl groups and aryl groups can be exemplified.

Of these substituents, more preferred groups are a halogen atom (—F, —Br, —Cl, —I), an alkoxyl group, an aryloxy group, an alkylthio group, an arylthio group, an N-alkylamino group, an N,N-dialkylamino group, an acyloxy group, an N-alkylcarbamoyloxy group, an N-arylcarbamoyloxy group, an acylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N-alkyl-N-arylcarbamoyl group, a sulfo group, a sulfonato group, a sulfamoyl group, an N-alkylsulfamoyl group, an N,N-dialkylsulfamoyl group, an N-arylsulfamoyl group, an N-alkyl-N-arylsulfamoyl group, a phosphono group, a phosphonato group, a dialkylphosphono group, a diarylphosphono group, a monoalkylphosphono group, an alkylphosphonato group, a monoarylphosphono group, an arylphosphonato group, a phosphonoxy group, a phosphonatoxy group, an aryl group, and an alkenyl group.

On the other hand, as the alkylene group in the substituted alkyl groups, divalent organic residues obtained by removing any one hydrogen atom on the above alkyl groups having from 1 to 20 carbon atoms can be exemplified, preferably a straight chain alkylene group having from 1 to 12 carbon atoms, a branched alkylene group having from 3 to 12 carbon atoms, and a cyclic alkylene group having from 5 to 10 carbon atoms are exemplified. The specific examples of the preferred substituted alkyl groups obtained by combining the above substituents and alkylene groups include a chloromethyl group, a bromomethyl group, a 2-chloroethyl group, a trifluoromethyl group, a methoxymethyl group, a methoxyethoxyethyl group, an allyloxymethyl group, a phenoxymethyl group, a methylthio-methyl group, a tolylthiomethyl group, an ethylaminoethyl group, a diethylaminopropyl group, a morpholinopropyl group, an acetyloxymethyl group, a benzoyloxymethyl group, an N-cyclohexylcarbamoyloxyethyl group, an N-phenylcarbamoyl-oxyethyl group, an acetylaminoethyl group, an N-methyl-benzoylaminopropyl group, a 2-oxyethyl group, a 2-oxypropyl group, a carboxypropyl group, a methoxycarbonylethyl group, an allyloxycarbonylbutyl group, a chlorophenoxycarbonyl-methyl group, a carbamoylmethyl group, an N-methylcarbamoyl-ethyl group, an N,N-dipropylcarbamoylmethyl group, an N-(methoxyphenyl)carbamoylethyl group, an N-methyl-N-(sulfophenyl)carbamoylmethyl group, a sulfobutyl group, a sulfonatobutyl group, a sulfamoylbutyl group, an N-ethyl-sulfamoylmethyl group, an N,N-dipropylsulfamoylpropyl group, an N-tolylsulfamoylpropyl group, an N-methyl-N-(phosphono-phenyl)sulfamoyloctyl group, a phosphonobutyl group, a phosphonatohexyl group, a diethylphosphonobutyl group, a diphenylphosphonopropyl group, a methylphosphonobutyl group, a methylphosphonatobutyl group, a tolylphosphonohexyl group, a tolylphosphonatohexyl group, a phosphonoxypropyl group, a phosphonatoxybutyl group, a benzyl group, a phenethyl group, an α-methylbenzyl group, a 1-methyl-1-phenylethyl group, a p-methylbenzyl group, a cinnamyl group, an allyl group, a 1-propenylmethyl group, a 2-butenyl group, a 2-methylallyl group, a 2-methylpropenylmethyl group, a 2-propynyl group, a 2-butynyl group, and a 3-butynyl group.

In the first embodiment, the amount of the hydrophilic macromer in the graft polymer is preferably from 10 to 90 wt %, more preferably from 15 to 85 wt %.

The graft polymers according to the invention have a weight average molecular weight of preferably from 5,000 to 1,000,000, more preferably from 10,000 to 500,000.

In the first embodiment, the content of the raft polymer in the image-recording layer is from 10 to 90 wt % of the total solids content of the image recording layer, preferably from 15 to 80 wt %, and more preferably from 20 to 70 wt %. When the content of the graft polymer in the image-recording layer is in this range, the effect of the invention of ensuring on-press developing properties, fine line reproducibility and press life can be obtained.

In the next place, the second embodiment is described below.

<Graft Polymer Having a Graft Chain of Hydrophobic Segment>

In the second embodiment, the graft polymer is a graft polymer comprising a hydrophilic main chain (trunk) having a graft chain of a hydrophobic segment as branches. By using this graft polymer, a lithographic printing plate precursor having excellent fine line reproducibility and press life can be obtained while maintaining good on-press developing properties.

In the second embodiment, "3) a macromer method" is also excellent in the synthesis of the graft polymer. In the second embodiment, the branch part of the graft polymer comprises a hydrophobic segment and the graft polymer can be easily obtained by copolymerization of a hydrophobic macromer and a hydrophilic monomer composing the trunk.

<Hydrophobic Macromer>

As the hydrophobic segment of a hydrophobic macromer (also called a macro monomer) for use in the invention, polymers obtained by polymerizing one monomer selected from well known hydrophobic monomers, e.g., acrylic esters, methacrylic esters, vinyl esters, styrenes, acrylonitrile, methacrylo-nitrile, maleic anhydride, maleic acid imide, and the like, or copolymers obtained by copolymerizing two or more of the above monomers are exemplified. The hydrophobic macromer used in the invention can be obtained by bonding a polymerizable group at the terminal of the hydrophobic segment.

The specific examples of the acrylic esters include methyl acrylate, ethyl acrylate, (n- or i-)propyl acrylate, (n-, i-, sec- or t-)butyl acrylate, amyl acrylate, 2-ethylhexyl acrylate, dodecyl acrylate, chloroethyl acrylate, cyclohexyl acrylate, allyl acrylate, trimethylolpropane monoacrylate, pentaerythritol monoacrylate, benzyl acrylate, methoxybenzyl acrylate, chlorobenzyl acrylate, hydroxybenzyl acrylate, hydroxyphenethyl acrylate, dihydroxyphenethyl acrylate, furfuryl acrylate, tetrahydrofurfuryl acrylate, phenyl acrylate, hydroxyphenyl acrylate, chlorophenyl acrylate, sulfamoylphenyl acrylate, and 2-(hydroxyphenylcarbonyloxy)-ethyl acrylate.

The specific examples of the methacrylic esters include methyl methacrylate, ethyl methacrylate, (n- or i-)propyl methacrylate, (n-, i-, sec or t-)butyl methacrylate, amyl methacrylate, 2-ethylhexyl methacrylate, dodecyl methacrylate, chloroethyl methacrylate, cyclohexyl methacrylate, allyl methacrylate, trimethylolpropane monomethacrylate, pentaerythritol monomethacrylate, benzyl methacrylate, methoxybenzyl methacrylate, chlorobenzyl methacrylate, hydroxybenzyl methacrylate, hydroxyphenethyl methacrylate, dihydroxyphenethyl methacrylate, furfuryl methacrylate, tetrahydrofurfuryl methacrylate, phenyl methacrylate, hydroxyphenyl methacrylate, chlorophenyl methacrylate, sulfamoylphenyl methacrylate, and 2-(hydroxyphenylcarbonyloxy)ethyl methacrylate.

The specific examples of the vinyl esters include vinyl acetate, vinyl butyrate and vinyl benzoate.

The specific examples of the styrenes include styrene, methylstyrene, dimethylstyrene, trimethylstyrene, ethyl-styrene, propylstyrene, cyclohexylstyrene, chloromethyl-styrene, trifluoromethylstyrene, ethoxymethylstyrene, acetoxymethylstyrene, methoxystyrene, dimethoxystyrene, chlorostyrene, dichlorostyrene, bromostyrene, iodostyrene, fluorostyrene and carboxystyrene.

The above hydrophobic monomers may further have a substituent. As the substituents, monovalent nonmetallic atomic groups exclusive of a hydrogen atom are used. The examples of preferred substituents include a halogen atom (—F, —Br, —Cl, —I), a hydroxyl group, an alkoxyl group, an aryloxy group, a mercapto group, an alkylthio group, an arylthio group, an alkyldithio group, an aryldithio group, an amino group, an N-alkylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, a ureido group, an N'-alkylureido group, an N',N'-dialkyl-ureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkyl-ureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl- N-alkoxy-carbonylamino group, an N-alkyl-N-aryloxycarbonylamino group, an N-aryl-N-alkoxycarbonylamino group, an N-aryl-N-aryloxy-carbonylamino group, a formyl group, an acyl group, a carboxyl group, an alkoxycarbonyl group, an aryloxycarbonyl group, a carbamoyl group, an N-alkylcarbamoyl group, an N,N-dialkyl-carbamoyl group, an N-arylcarbamoyl group, an N,N-diaryl-carbamoyl group, an N-alkyl-N-arylcarbamoyl group, an alkyl-sulfinyl group, an arylsulfinyl group, an alkylsulfonyl group, an arylsulfonyl group, a sulfo group ($—SO_3H$) and a conjugate base group thereof (hereinafter referred to as a sulfonato group), an alkoxysulfonyl group, an aryloxysulfonyl group, a sulfinamoyl group, an N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, a phosphono group ($—PO_3H_2$) and a conjugate base group thereof (hereinafter referred to as a phosphonato group), a dialkyl-phosphono group ($—PO_3(alkyl)_2$), a diarylphosphono group ($—PO_3(aryl)_2$), an alkylarylphosphono group ($—PO_3(alkyl)-(aryl)$), a monoalkylphosphono group ($—PO_3H(alkyl)$) and a conjugate base group thereof (hereinafter referred to as an alkylphosphonato group), a monoarylphosphono group ($—PO_3H-(aryl)$) and a conjugate base group thereof (hereinafter referred to as an arylphosphonato group), a phosphonoxy group ($—OPO_3H_2$) and a conjugate base group thereof (hereinafter referred to as a phosphonatoxy group), a dialkylphosphonoxy group ($—OPO_3(alkyl)_2$), a diarylphosphonoxy group ($—OPO_3-(aryl)_2$), an alkylarylphosphonoxy group ($—OPO_3(alkyl)(aryl)$), a monoalkylphosphonoxy group ($—OPO_3H(alkyl)$) and a conjugate base group thereof (hereinafter referred to as an alkylphosphonatoxy group), a monoarylphosphonoxy group ($—OPO_3H(aryl)$) and a conjugate base group thereof (hereinafter referred to as an arylphosphonatoxy group), a morpholino group, a cyano group, a nitro group, an aryl group, an alkenyl group, and an alkynyl group.

As the specific examples of the alkyl groups in these substituents, a methyl group, an ethyl group, a propyl group, a butyl group, a pentyl group, a hexyl group, a heptyl group, an octyl group, an isopropyl group, an isobutyl group, an s-butyl group, a t-butyl group, an isopentyl group, a neopentyl group, a 1-methylbutyl group, an isohexyl group, a 2-ethylhexyl group, a 2-methylhexyl group and a cyclopentyl group are exemplified. Of these groups, a hydrogen atom, a methyl group and an ethyl group are more preferred for their effects and easy availability. As the specific examples of the aryl groups, a phenyl group, a biphenyl group, a naphthyl group, a tolyl group, a xylyl group, a mesityl group, a cumenyl group, a chlorophenyl group, a bromophenyl group, a chloromethylphenyl group, a hydroxyphenyl group, a methoxyphenyl group, an ethoxyphenyl group, a phenoxyphenyl group, an acetoxyphenyl group, a benzoyloxyphenyl group, a methylthiophenyl group, a phenylthiophenyl group, a methylaminophenyl group, a dimethylaminophenyl group, an acetylaminophenyl group, a carboxyphenyl group, a methoxycarbonylphenyl group, an ethoxyphenylcarbonyl group, a phenoxycarbonylphenyl group, an N-phenylcarbamoylphenyl group, a phenyl group, a cyanophenyl group, a sulfophenyl group, a sulfonatophenyl group, a phosphonophenyl group and a phosphonatophenyl group are exemplified. As the examples of the alkenyl groups, a vinyl group, a 1-propenyl group, a 1-butenyl group, a cinnamyl group and a 2-chloro-1-ethenyl group are exemplified. As the examples of the alkynyl groups, an ethynyl group, a 1-propynyl group, a 1-butynyl group and a trimethylsilylethynyl group are exemplified. As $G_1$ in the acyl group ($G_1CO—$), a hydrogen atom and the above-described alkyl groups and aryl groups can be exemplified.

Of these substituents, more preferred groups are a halogen atom (—F, —Br, —Cl, —I), an alkoxyl group, an aryloxy group, an alkylthio group, an arylthio group, an N-alkylamino group, an N,N-dialkylamino group, an acyloxy group, an N-alkylcarbamoyloxy group, an N-arylcarbamoyloxy group, an acylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N-alkyl-N-arylcarbamoyl group, a sulfo group, a sulfonato group, a sulfamoyl group, an N-alkylsulfamoyl group, an N,N-dialkylsulfamoyl group, an N-arylsulfamoyl group, an N-alkyl-N-arylsulfamoyl group, a phosphono group, a phosphonato group, a dialkylphosphono group, a diarylphosphono group, a monoalkylphosphono group, an alkylphosphonato group, a monoarylphosphono group, an arylphosphonato group, a phosphonoxy group, a phosphonatoxy group, an aryl group, and an alkenyl group.

On the other hand, as the alkylene group in the substituted alkyl groups, divalent organic residues obtained by removing any one hydrogen atom on the above alkyl groups having from 1 to 20 carbon atoms can be exemplified, preferably a straight chain alkylene group having from 1 to 12 carbon atoms, a branched alkylene group having from 3 to 12 carbon atoms, and a cyclic alkylene group having from 5 to 10 carbon atoms are exemplified. The specific examples of the preferred substituted alkyl groups obtained by combining the above substituents and alkylene groups include a chloromethyl group, a bromomethyl group, a 2-chloroethyl group, a trifluoromethyl group, a methoxymethyl group, a methoxyethoxyethyl group, an allyloxymethyl group, a phenoxymethyl group, a methylthio-methyl group, a tolylthiomethyl group, an ethylaminoethyl group, a diethylaminopropyl group, a morpholinopropyl group, an acetyloxymethyl group, a benzoyloxymethyl group, an N-cyclohexylcarbamoyloxyethyl group, an N-phenylcarbamoyl-oxyethyl group, an acetylaminoethyl group, an N-methyl-benzoylaminopropyl group, a 2-oxyethyl group, a 2-oxypropyl group, a carboxypropyl group, a methoxycarbonylethyl group, an allyloxycarbonylbutyl group, a chlorophenoxycarbonyl-methyl group, a carbamoylmethyl group, an N-methylcarbamoyl-ethyl group, an N,N-dipropylcarbamoylmethyl group, an N-(methoxyphenyl)carbamoylethyl group, an N-methyl-N-(sulfophenyl)carbamoylmethyl group, a sulfobutyl group, a sulfonatobutyl group, a sulfamoylbutyl group, an N-ethyl-sulfamoylmethyl group, an N,N-dipropylsulfamoylpropyl group, an N-tolylsulfamoylpropyl group, an N-methyl-N-(phosphono-phenyl)sulfamoyloctyl group, a phosphonobutyl group, a phosphonatohexyl group, a diethylphosphonobutyl group, a diphenylphosphonopropyl group, a methylphosphonobutyl group, a methylphosphonatobutyl group, a tolylphosphonohexyl group, a tolylphosphonatohexyl group, a phosphonoxypropyl group, a phosphonatoxybutyl group, a benzyl group, a phenethyl group, an α-methylbenzyl group, a 1-methyl-1-phenylethyl group, a p-methylbenzyl group, a cinnamyl group, an allyl group, a 1-propenylmethyl group, a 2-butenyl group, a 2-methylallyl group, a 2-methylpropenylmethyl group, a 2-propynyl group, a 2-butynyl group, and a 3-butynyl group.

The hydrophobic macromers preferably have a molecular weight of from 400 to 100,000, more preferably from 1,000 to 50,000, and particularly preferably from 1,500 to 20,000. In this range of the molecular weight, the effect of the invention can be exhibited without impairing the polymerizability with the copolymerizable monomers for forming main chains.

<Hydrophilic Monomer>

In the second embodiment, as the hydrophilic monomers for forming a main chain, well-known monomers such as an amido group-containing monomer, an acid group-containing monomer, an alkali metal salt of an acid group-containing monomer, a quaternary ammonium salt-containing monomer, and a hydroxyl group-containing monomer are exemplified. Graft polymers can be synthesized by the copolymerization of one or more monomers arbitrarily selected from these hydrophilic monomers with one or more of the above hydrophobic macromers.

As the specific examples of the amido group-containing, monomers, 2-acrylamide-2-methylpropanesulfonic acid, N,N-dimethylacrylamide, acrylamide, N,N-diethylacrylamide, N-isopropylacrylamide, acryloylmorpholine, methacrylamide, and N-methylolacrylamide are exemplified.

As the specific examples of the acid group-containing monomers, methacrylic acid, acrylic acid and styrenesulfonic acid are exemplified. The specific examples of the alkali metal salts of an acid group-containing monomer include sodium methacrylate, sodium acrylate, sodium styrenesulfonate, sodium sulfonate ethoxymethacrylate, sodium sulfonate ethoxyacrylate, and sodium mono-2-acryloyloxyethyl acid phosphate.

As the specific examples of the quaternary ammonium salt-containing monomers, hydroxyethyltrimethylammonium chloride methacrylate, hydroxypropyltrimethylammonium chloride methacrylate, and hydroxyethyltrimethylammonium chloride acrylate are exemplified.

The specific examples of the hydroxyl group-containing monomers include 2-hydroxyethyl acrylate, 2-hydroxyethyl methacrylate, 3-hydroxypropyl acrylate, 3-hydroxypropyl methacrylate, and 2,3-dihydroxypropyl methacrylate.

In the second embodiment, the hydrophilicity of a main chain can be properly adjusted by copolymerizing hydrophobic monomers besides the above hydrophilic monomers to the main chain of the graft polymer. As the examples of the hydrophobic monomers, the hydrophobic macromers shown in the item of <Hydrophobic macromer> can be exemplified. The amount of the hydrophobic monomers introduced to the main chain of the graft polymer is preferably from 0 to 50 mol %, more preferably from 0 to 30 mol %.

In the second embodiment, the content of the hydrophobic macromer in the graft polymer is preferably from 10 to 90 wt %, more preferably from 15 to 85 wt %.

In the second embodiment, the amount of the hydrophilic monomer in the graft polymer is preferably less than 50 wt %, more preferably less than 30 wt %.

Further, the graft polymer preferably has weight average molecular weight of from 5,000 to 1,000,000, more preferably from 10,000 to 500,000.

In the second embodiment, the content of the graft polymer in the image recording layer is from 10 to 90 wt % of the total solids content of the image recording layer, preferably from 15 to 80 wt %, and more preferably from 20 to 70 wt %. When the graft polymer content in the image recording layer is in this range, the effect of the invention of ensuring on-press developing properties, fine line reproducibility and press life can be obtained.

<Infrared Absorber>

When the lithographic printing plate precursor of the invention is subjected to exposure for image formation with infrared lasers of the wavelengths of from 760 to 1,200 nm as the light sources, it is generally essential to use an infrared absorber. An infrared absorber has a function of converting the absorbed infrared rays to heat. A radical is generated by the thermal decomposition of a polymerization initiator (a radical generator) described later by the heat generated at this time. The infrared absorbers for use in the invention are dyes or pigments having an absorption maximum in the wavelengths of from 760 to 1,200 nm.

As dyes for this purpose, commercially available dyes and well-known dyes described in literatures, e.g., *Senryo Binran* (*Dye Handbook*), compiled by Yuki Gosei Kagaku Kyokai (1970); and the like can be used. Specifically, azo dyes, metal complex salt azo dyes, pyrazolone azo dyes, naphthoquinone dyes, anthraquinone dyes, phthalocyanine dyes, carbonium dyes, quinoneimine dyes, methine dyes, cyanine dyes, squarylium dyes, pyrylium salts and metal thiolate complexes are exemplified.

As preferred dyes, e.g., the cyanine dyes disclosed in JP-A-58-125246, JP-A-59-84356 and JP-A-60-78787, the methine dyes disclosed in JP-A-58-173696, JP-A-58-181690 and JP-A-58-194595, the naphthoquinone dyes disclosed in JP-A-58-112793, JP-A-58-224793, JP-A-59-48187, JP-A-59-73996, JP-A-60-52940 and JP-A-60-63744, the squarylium dyes disclosed in JP-A-58-112792, and the cyanine dyes disclosed in British Patent 434,875 are exemplified.

Further, the near infrared ray-absorbing sensitizers disclosed in U.S. Pat. No. 5,156,938 are also preferably used, in addition, the substituted arylbenzo(thio)pyrylium salts disclosed in U.S. Pat. No. 3,881,924, the trimethine thiapyrylium salts disclosed in JP-A-57-142645 (corresponding to U.S. Pat. No. 4,327,169), the pyrylium-based compounds disclosed in JP-A-58-181051, JP-A-58-220143, JP-A-59-41363, JP-A-59-84248, JP-A-59-84249, JP-A-59-146063 and JP-A-59-146061, the cyanine dyes disclosed in JP-A-59-216146, the pentamethine thiopyrylium salts disclosed in U.S. Pat. No. 4,283,475, and the pyrylium compounds disclosed in JP-B-5-13514 (the term "JP-B" as used herein refers to an "examined Japanese patent publication") and JP-B-5-19702 are also preferably used in the present invention. As other examples of preferred dyes, the near infrared ray-absorbing dyes disclosed as the compounds represented by formulae (I) and (II) in U.S. Pat. No. 4,756,993 can be exemplified.

As other preferred examples of infrared absorbing dyes for use in the invention, the indolenine cyanine dyes disclosed in JP-A-2002-278057 as shown below are exemplified.

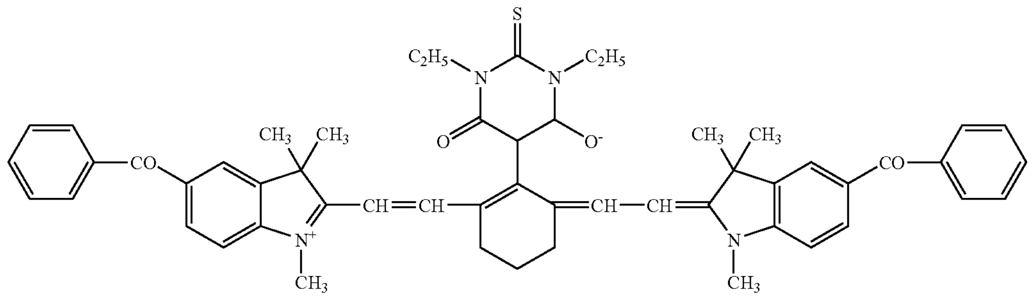

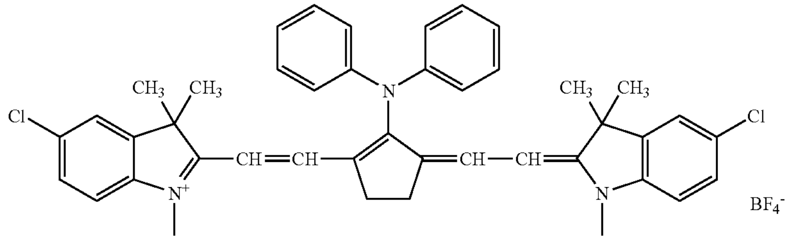

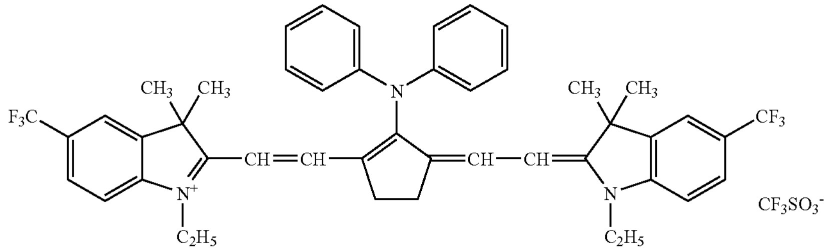

Of the above dyes, a cyanine dye, a squarylium dye, a pyrylium salt, a nickel thiolate complex and an indolenine cyanine dye are very preferred. A cyanine dye and an indolenine cyanine dye are more preferred, and a cyanine dye represented by the following formula (I) is particularly preferred.

(I)

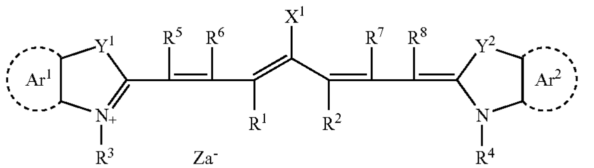

In formula (I), $X^1$ represents a hydrogen atom, a halogen atom, —$NPh_2$, $X^2$-$L^1$, or the following shown group; $X^2$ represents an oxygen atom, a nitrogen atom or a sulfur atom; and $L^1$ represents a hydrocarbon group having from 1 to 12 carbon atoms, an aromatic ring having a hetero atom, or a hydrocarbon group containing a hetero atom and having from 1 to 12 carbon atoms. The hetero atoms used show N, S, O, a halogen atom and Se. $X_a^-$ is defined as the same with the later-described $Z_a^-$, and $R^a$ represents a substituent selected from a hydrogen atom, an alkyl group, an aryl group, a substituted or unsubstituted amino group and a halogen atom.

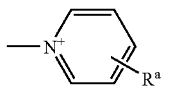

$X_a^-$ $R^1$ and $R^2$ each represents a hydrocarbon group having from 1 to 12 carbon atoms. In view of the storage stability of a recording layer coating solution, $R^1$ and $R^2$ each preferably represents a hydrocarbon group having 2 or more carbon atoms, and particularly preferably $R^1$ and $R^2$ are bonded to each other to form a 5- or 6-membered ring.

$Ar^1$ and $Ar^2$, which may be the same or different, each represents an aromatic hydrocarbon group which may have a substituent. The examples of preferred aromatic hydrocarbon groups include a benzene ring and a naphthalene ring. The preferred examples of the substituents of the aromatic hydrocarbon groups include a hydrocarbon group having 12 or less carbon atoms, a halogen atom, and an alkoxyl group having 12 or less carbon atoms. $Y^1$ and $Y^2$, which may be the same or different, each represents a sulfur atom or a dialkylmethylene group having 12 or less carbon atoms. $R^3$ and $R^4$, which may be the same or different, each represents a hydrocarbon group having 20 or less carbon atoms which may have a substituent. The preferred examples of the substituents of the hydrocarbon groups include an alkoxyl group having 12 or less carbon atoms, a carboxyl group and a sulfo group. $R^5$, $R^6$, $R^7$ and $R^8$, which may be the same or different, each represents a hydrogen atom or a hydrocarbon group having 12 or less carbon atoms, preferably a hydrogen atom because of easy availability of the material. $Z_a^-$ represents a counter anion, provided that when a cyanine dye represented by formula (I) has an anionic substituent within the structure and the neutralization of the electric charge is not necessary, $Z_a^-$ is not necessary. $Z_a^-$ preferably represents a halogen ion, a perchlorate ion, a tetrafluoroborate ion, a hexafluorophosphate ion or a sulfonate ion for the storage stability of a recording layer coating solution, and particularly preferably, a perchlorate ion, a hexafluorophosphate ion or an arylsulfonate ion.

As the specific examples of cyanine dyes represented by formula (I) that can be preferably used in the invention, those disclosed in JP-A-2001-133969, paragraphs [0017] to [0019] can be exemplified.

Further, as particularly preferred other examples, the indolenine cyanine dyes disclosed in IP-A-2002-278057 are exemplified.

As the pigments used in the present invention, commercially available pigments and the pigments described in *Color Index* (*C.I.*) *Binran* (*Color Index Bulletin*), *Shaishin Ganryo Binran* (*The Latest Pigment Handbook*), compiled by Nippon Ganryo Gijutsu Kyokai (1977), *Shaishin Ganryo Oyo Gijutsu* (*The Latest Pigment Applied Techniques*), CMC Publishing Co. Ltd. (1986), *Insatsu Ink Gijutsu* (*Printing Ink Techniques*), CMC Publishing Co. Ltd. (1984) can be used.

Various kinds of pigments can be used in the invention, e.g., black pigments, yellow pigments, orange pigments, brown pigments, red pigments, purple pigments, blue pigments, green pigments, fluorescent pigments, metallic powder pigments, and polymer-bond pigments can be exemplified. Specifically, insoluble azo pigments, azo lake pigments, condensation azo pigments, chelate azo pigments, phthalocyanine pigments, anthraquinone pigments, perylene and perinone pigments, thioindigo pigments, quinacridone pigments, dioxazine pigments, isoindolinone pigments, quinophthalone pigments, in mold lake pigments, azine pigments, nitroso pigments, nitro pigments, natural pigments, fluorescent pigments, inorganic pigments, and carbon black can be used. Of these pigments, carbon black is preferably used.

These pigments can be used without surface treatment or may be surface-treated. As the methods of surface treatments, a method of coating the surfaces of pigments with resins and waxes, a method of adhering surfactants, and a method of bonding reactive substances (e.g., silane coupling agents, epoxy compounds, or polyisocyanate) on the surfaces of pigments can be exemplified. These surface treatment methods are described in *Kinzoku Sekken no Seishitsu to Oyo* (*Natures and Applications of Metal Soaps*), Saiwai Shobo Co., Ltd., *Insatsu Ink Gijutsu* (*Printing Ink Techniques*), CMC Publishing Co., Ltd. (1984), and *Shaishin Ganryo Oyo Gijutsu* (*The Latest Pigment Applied Techniques*), CMC Publishing Co., Ltd. (1986).

The particle size of pigments is preferably from 0.01 to 10 μm, more preferably from 0.05 to 1 μm, and particularly preferably from 0.1 to 1 μm. When the particle size of pigments is in this range, the stability of the pigment dispersion in an image-recording layer coating solution and uniformity of an image-recording layer can be obtained.

Well-know dispersing techniques used in the manufacture of inks and toners can be used as the dispersing methods of pigments. The examples of dispersing apparatus include an ultrasonic disperser, a sand mill, an attritor, a pearl mill, a super-mill, a ball mill, an impeller, a disperser, a KD mill, a colloid mill, a dynatron, a three-roll mill and a pressure kneader, and details are described in *Shaishin Ganryo Oyo Gijutsu* (*The Latest Pigment Application Techniques*), CMC Publishing Co., Ltd. (1986).

These infrared absorbers may be added to the same layer with other components, or a different layer may be provided and added thereto. However, it is preferred that infrared absorbers are added so that the absorbance of an image recording layer at the maximum absorption wavelength in the range of the wavelength of from 760 to 1,200 nm is from 0.3 to 1.2 by reflection measuring method when a negative lithographic printing plate precursor is prepared, more preferably from 0.4 to 1.1. When the addition amount of infrared absorbers is in this range, the polymerization reaction proceeds uniformly in the depth direction of the image-recording layer and good layer strength of the image area and the adhesion to the support can be obtained.

The absorbance of an image-recording layer can be adjusted by the amount of an infrared absorber added to the image-recording layer and the thickness of the image-recording layer. Absorbance can be measured by ordinary methods, e.g., a method of forming an image-recording layer having a thickness in a dry coating weight necessary as the lithographic printing plate on a reflective support, e.g., an aluminum support, and measuring the reflection density with an optical densitometer, and a method of measuring the absorbance by a reflection method with a spectrophotometer using an integrating sphere are exemplified.

The content of the infrared absorber in the image recording layer is preferably from 0.1 to 50 wt % of the total solids content of the image recording layer, more preferably from 0.5 to 30 wt %, and still more preferably from 1 to 20 wt %, in view of sensitivity and stain in the non-imaging area which is generated at the printing.

<Other Image Recording Layer Components>

It is preferred for the image-recording layer of the invention to contain a polymerization initiator capable of generating radicals and a polymerizable compound capable of polymerization and hardening by the radicals. Further, if necessary, the image-recording layer can contain various additives such as a binder polymer, a surfactant, a colorant, a print out agent, a polymerization inhibitor, a higher fatty acid derivative, a plasticizer, inorganic fine particles, and a low molecular weight hydroplilic compound. These additives are described below.

<Polymerization Initiator>

It is preferred for the image-recording layer of the invention to contain a polymerization initiator capable of generating radicals by heat or light, or both energies thereof, and initiating and accelerating the hardening reaction of the later-described polymerizable compound. Above all, thermal decomposing type radical generators that are decomposed by heat and generate radicals are useful. By using these radical generators in combination with the above infrared absorbers, the infrared absorbers generate heat when irradiated with infrared lasers to thereby generate radicals by the heat, so that heat mode recording becomes possible.

As the radical generators, onium salts, triazine compounds having a trihalomethyl group, peroxides, azo-based polymerization initiators, azide compounds and quinone diazide are exemplified. Of these, onium salts are preferred for high sensitivity. Onium salts that can be preferably used as radical initiators are described below. As preferred onium salts, an iodonium salt, a diazonium salt and a sulfonium salt are exemplified. In the present invention, these onium salts function as radical polymerization initiators not as acid generators. Onium salts particularly preferably used in the invention are the onium salts represented by the following formulae (II), (III) and (IV).

$$Ar^{11}—I^{+}—Ar^{12} \quad Z^{11-} \qquad (II)$$

$$Ar^{21}—N^{+}{\equiv}N \quad Z^{21-} \qquad (III)$$

(IV)

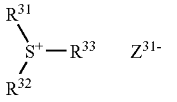

In formula (II), $Ar^{11}$ and $Ar^{12}$ each represents an aryl group having 20 or less carbon atoms, which may have a substituent, and as the preferred substituents of the aryl groups, a halogen atom, a nitro group, an alkyl group having 12 or less carbon atoms, an alkoxyl group having 12 or less carbon atoms, and an aryloxy group having 12 or less carbon atoms are exemplified. $Z^{11-}$ represents a counter ion selected from the group consisting of a halogen ion, a perchlorate ion, a tetrafluoroborate ion, a hexafluorophosphate ion, a carboxylate ion, and a sulfonate ion, preferably a perchlorate ion, a hexafluorophosphate ion, a carboxylate ion, or an arylsulfonate ion.

In formula (III), $Ar^{21}$ represents an aryl group having 20 or less carbon atoms, which may have a substituent, and as the preferred substituents, a halogen atom, a nitro group, an alkyl group having 12 or less carbon atoms, an alkoxyl group having 12 or less carbon atoms, an aryloxy group having 12 or less carbon atoms, an alkylamino group having 12 or less carbon atoms, a dialkylamino group having 12 or less carbon atoms, an arylamino group having 12 or less carbon atoms, and a diarylamino group having 12 or less carbon atoms are exemplified. $Z^{21-}$ represents a counter ion having the same meaning as $Z^{11-}$.

In formula (IV), $R^{31}$, $R^{32}$ and $R^{33}$, which may be the same or different, each represents a hydrocarbon group having 20 or less carbon atoms, which may have a substituent. As the examples of the preferred substituents, a halogen atom, a nitro group, an alkyl group having 12 or less carbon atoms, an alkoxyl group having 12 or less carbon atoms, and an aryloxy group having 12 or less carbon atoms are exemplified. $Z^{31-}$ represents a counter ion having the same meaning as $Z^{11-}$.

As the specific examples of the onium salts that can be preferably used in the invention as radical generators, the onium salts disclosed in JP-A-2001-133969, JP-A-2001-343742 and JP-A-2002-148790 are exemplified. The specific examples of the onium salts represented by formula (II) ([OI-1] to [OI-10]), the onium salts represented by formula (III) ([ON-1] to [ON-5]) and the onium salts represented by formula (IV) ([OS-1] to [OS-10]) are shown below, but the present invention is not restricted to these compounds.

[OI-1]

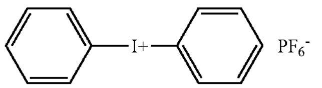

[OI-2]

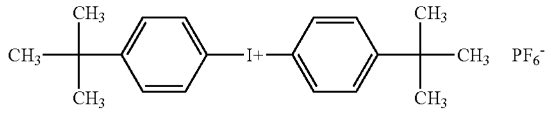

[OI-3]

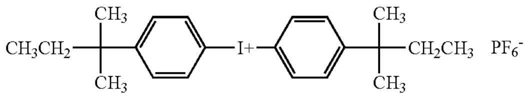

[OI-4]

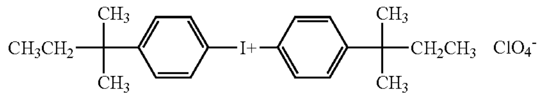

[OI-5]

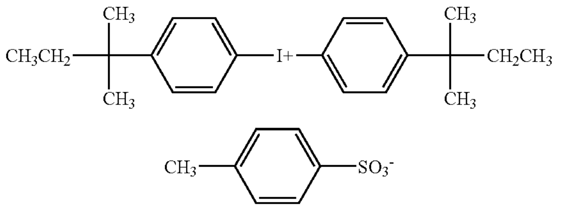

[OI-6]

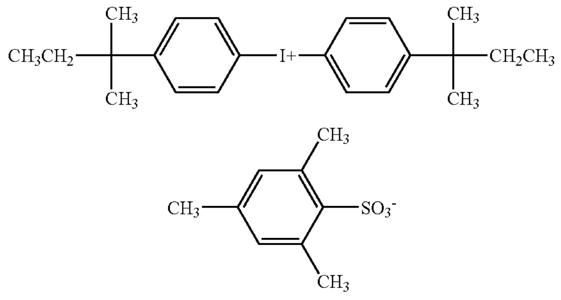

-continued
[OI-7]
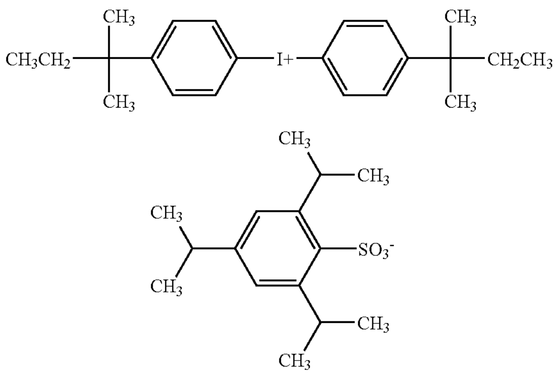
[OI-8]
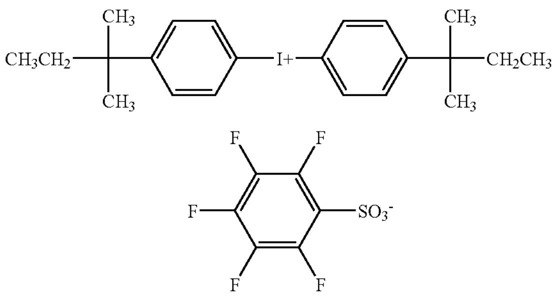
[OI-9]
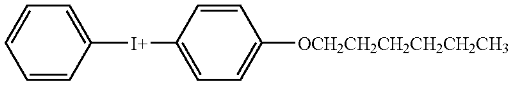
[OI-10]
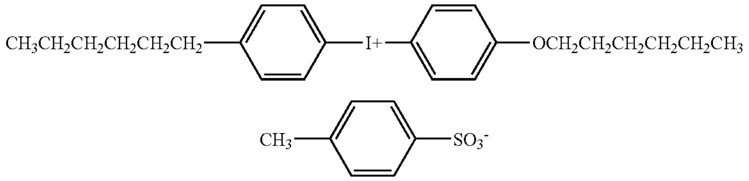
[ON-1]
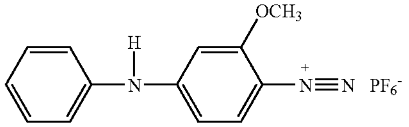
[ON-2]
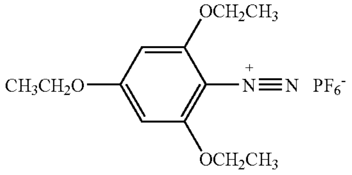
[ON-3]
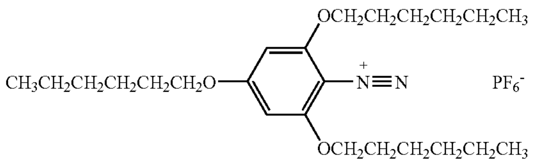
[ON-4]
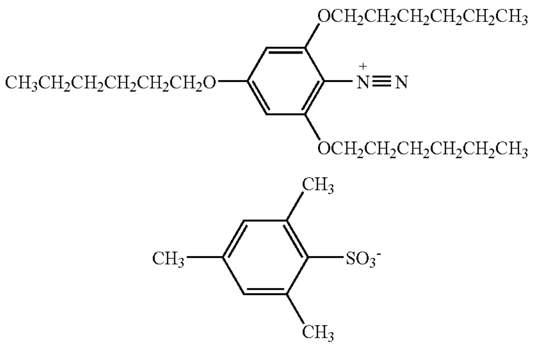
[ON-5]
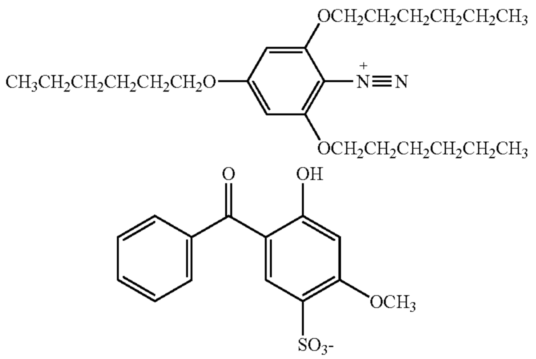
[OS-1]
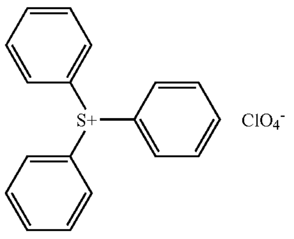

-continued
[OS-2]
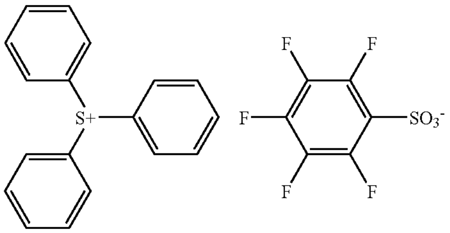
[OS-3]
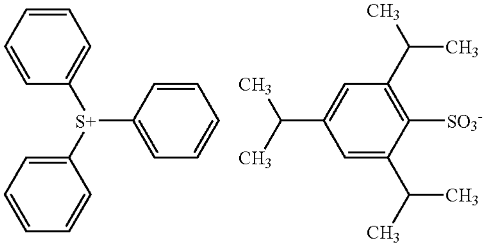
[OS-4]
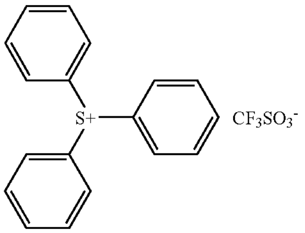
[OS-5]
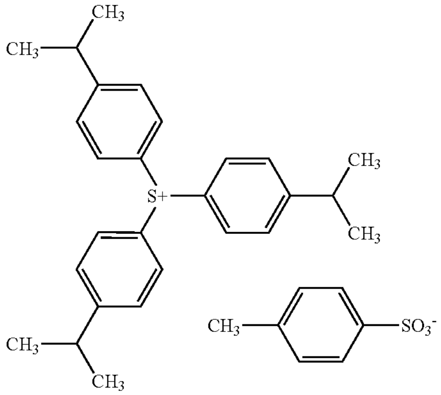
[OS-6]
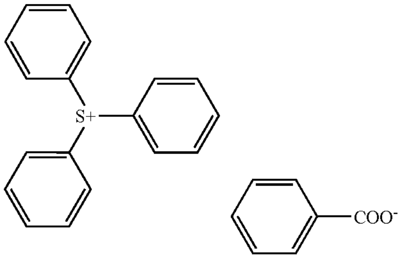
[OS-7]
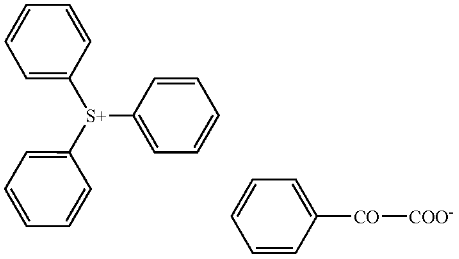
[OS-8]
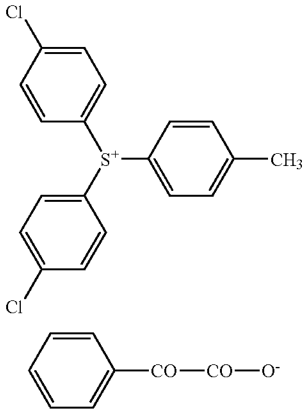
[OS-9]
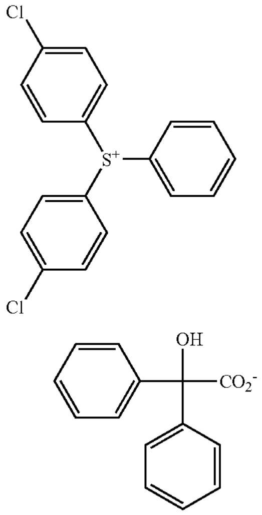

-continued

[OS-10]

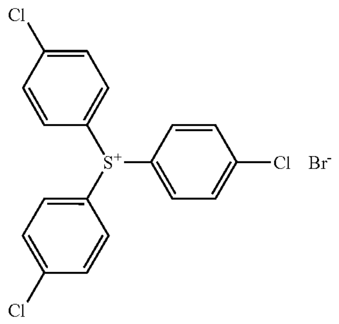

As other preferred polymerization initiators, special aromatic sulfonium salts disclosed in JP-A-2002-6482 are exemplified.

Radical generators for use in the invention preferably have maximum absorption wavelength of 400 nm or less, more preferably 360 nm or less. By using radical generators having absorption wavelength in the ultraviolet region, the lithographic printing plate precursor can be handled under white light.

Polymerization initiators can be used in proportion of from 0.1 to 50 wt % to the total solids content constituting the image-recording layer, preferably from 0.5 to 30 wt %, and particularly preferably from 1 to 20 wt %. By using polymerization initiators in this range, good sensitivity and soiling resistance of the non-image area in printing can be obtained. Polymerization initiators may be used alone, or two or more of them may be used in combination. Polymerization initiators may be added to the same layer with other components, or other layer may be provided for polymerization initiators.

<Polymerizable Compound>

For efficiently perform a hardening reaction, it is preferred for the image-recording layer in the invention to contain a polymerizable compound. The polymerizable compounds usable in the invention are addition polymerizable compounds having at least one ethylenic unsaturated double bond, and they are selected from the compounds having at least one, preferably two or more, ethylenic unsaturated bond at terminal. These compounds are well known in the field of this industry, and they can be used with no particular limitation in the invention. These polymerizable compounds have chemical forms of, e.g., a monomer or a prepolymer, i.e., a dimer, a trimer or an oligomer, and a mixture and a copolymer of them. As the examples of monomers and copolymers of them, unsaturated carboxylic acids (e.g., acrylic acid, methacrylic acid, itaconic acid, crotonic acid, isocrotonic acid, maleic acid, etc.), and esters and amides of these unsaturated carboxylic acids are exemplified, and preferably esters of unsaturated carboxylic acids and aliphatic polyhydric alcohol compounds, and amides of unsaturated carboxylic acid and aliphatic polyhydric amine compounds are used. Further, the addition reaction products of esters and amides of unsaturated carboxylic acids having a nucleophilic substituent such as a hydroxyl group, an amino group or a mercapto group with monofunctional or polyfunctional isocyanates or epoxies, and the dehydration condensation reaction products of unsaturated carboxylic acids with monofunctional or polyfunctional carboxylic acids are also preferably used. Furthermore, the addition reaction products of unsaturated carboxylic esters or amides having an electrophilic substituent such as an isocyanate group or an epoxy group with monofunctional or polyfunctional alcohols, amines or thiols, and the substitution reaction products of unsaturated carboxylic esters or amides having a separable substituent such as a halogen group or a tosyloxy group with monofunctional or polyfunctional alcohols, amines or thiols are also preferably used. As another example, it is also possible to use compounds obtained by substituting the unsaturated carboxylic acids with unsaturated phosphonic acid, styrene, vinyl ether, etc.

The specific examples of the monomers of esters of aliphatic polyhydric alcohol compounds and unsaturated carboxylic acids include, as acrylic esters, ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl)ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate, polyester acrylate oligomer, isocyanuric acid EO-modified triacrylate, etc.

As methacrylic esters, the examples include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)-phenyl]dimethylmethane, bis[p-(methacryloxyethoxy)phenyl]-dimethylmethane, etc.

As itaconic esters, the examples include ethylene glycol diitaconate, propylene glycol diitaconate, 1,3-butanediol diitaconate, 1,4-butanediol diitaconate, tetramethylene glycol diitaconate, pentaerythritol diitaconate, sorbitol tetraitaconate, etc. As crotonic esters, the examples include ethylene glycol dicrotonate, tetramethylene glycol dicrotonate, pentaerythritol dicrotonate, sorbitol tetradicrotonate, etc. As isocrotonic esters, the examples include ethylene glycol diisocrotonate, pentaerythritol diisocrotonate, sorbitol tetraisocrotonate, etc. As maleic esters, the examples include ethylene glycol dimaleate, triethylene glycol dimaleate, pentaerythritol dimaleate, sorbitol tetramaleate, etc.

As the examples of other esters, e.g., the aliphatic alcohol esters disclosed in JP-B-51-47334 and JP-A-57-196231, the esters having an aromatic skeleton disclosed in JP-A-59-5240, JP-A-59-5241 and JP-A-2-226149, and the esters containing an amino group disclosed in JP-A-1-165613 are also preferably used in the invention. The above ester monomers can also be used as mixtures.

Further, the specific examples of the amide monomers of aliphatic polyhydric amine compounds and unsaturated carboxylic acids include methylenebis-acrylamide, methylenebis-methacrylamide, 1,6-hexamethylenebis-acrylamide, 1,6-hexamethylenebis-methacrylamide, diethylenetriaminetris-acrylamide, xylylenebis-acrylamide, xylylenebis-methacrylamide, etc. As other preferred amide monomers, those having a cyclohexylene structure disclosed in JP-B-54-21726 can be exemplified.

Further, urethane-based addition polymerizable compounds manufactured by the addition reaction of isocyanate and a hydroxyl group are also preferably used. As the specific examples of such compounds, as disclosed in JP-B-48-41708, a vinyl urethane compound containing two or more polymerizable vinyl groups in one molecule obtained by adding vinyl monomer having a hydroxyl group represented by the following formula (V) to a polyisocyanate compound having two or more isocyanate groups in one molecule is exemplified.

$$CH_2{=}C(R_4)COOCH_2CH(R_5)OH \qquad (V)$$

wherein $R_4$ and $R_5$ each represents H or $CH_3$.

The urethane acrylates disclosed in JP-A-51-37193 and JP-B-2-32293, JP-B-2-16765, and the urethane compounds having an ethylene oxide skeleton disclosed in JP-B-58-49860, JP-B-56-17654, JP-B-62-39417 and JP-B-62-39418 are also preferably used in the invention. In addition, extremely high speed photopolymerizable compositions can be obtained by using addition polymerizable compounds having an amino structure and a sulfide structure in the molecule as disclosed in JP-A-63-277653, JP-A-63-260909 and JP-A-1-105238.

As other examples, polyfunctional acrylates and methacrylates, such as polyester acrylates, and epoxy acrylates obtained by reacting epoxy resins with acrylic acids or methacrylic acids as disclosed in JP-A-48-64183, JP-B-49-43191 and JP-B-52-30490 can be exemplified. The specific unsaturated compounds disclosed in JP-B-46-43946, JP-B-1-40337 and JP-B-1-40336, and the vinyl sulfonic acid compounds disclosed in JP-A-2-25493 can also be exemplified. Further, according to cases, the structures containing a perfluoroalkyl group disclosed in JP-A-61-22048 are preferably used. Further, the photo-curable monomers and oligomers introduced into Bulletin of Nippon Setchaku Kyokai, Vol. 20, No. 7, pp. 300–308 (1984) can also be used.

The details in usage of these addition polymerizable compounds, e.g., what structure is to be used, whether the compound is to be used alone or in combination, or what an amount is to be used, can be optionally set up according to the final design of the performances of the lithographic printing plate precursor. For example, these things are selected on the basis of the following aspects.

In the point of sensitivity, the structure containing many unsaturated groups per a molecule is preferred and bifunctional or higher functional groups are preferred in many cases. For increasing the strength of an image area, i.e., a hardened film, trifunctional or higher functional groups are preferred, and it is also effective to use different functional numbers and different polymerizable groups (e.g., acrylic ester, methacrylic ester, styrene compounds, vinyl ether compounds) in combination to control both speed and strength.

Further, the selection and usage of the addition polymerizable compounds are important factors for the compatibility with other components in an image-recording layer (e.g., a binder polymer, a polymerization initiator, a colorant) and dispersibility, for example, in some cases compatibility can be improved by using low purity compounds or two or more compounds in combination. Further, it is also possible to select a compound having a specific structure for the purpose of improving the adhesion property to a support and an overcoat layer described later.

Polymerizable compounds are used preferably in an amount of from 5 to 80 wt % to the nonvolatile components in an image-recording layer, and more preferably from 25 to 75 wt %. Polymerizable compounds may be used alone, or two or more compounds may be used in combination, In addition, the structure, blending and addition amount of addition polymerizable compounds can be properly selected in view of the degree of polymerization hindrance by oxygen, resolution, a fogging property, refractive index change and surface stickiness and, further, in some cases, a layer constitution and a coating method of undercoating and upper coating may be taken.

<Binder Polymer>

Binder polymers can be used in the image-recording layer in the invention besides the graft polymers. The binder polymers usable in the invention are not particularly restricted and well known compounds can be used, and linear organic polymers having a film-forming property are preferably used. The examples of such binder polymers include acrylic resins, polyvinyl acetal resins, polyurethane resins, polyurea resins, polyimide resins, polyamide resins, epoxy resins, methacrylic resins, polystyrene resins, novolak type phenolic resins, polyester resin, synthetic rubbers and natural rubbers.

It is preferred for binder polymers to have a crosslinking property to improve the film strength of an image area. To give a crosslinking property to binder polymers, it is effective to introduce a crosslinkable functional group such as an ethylenic unsaturated bond into the main chain or side chain of the binder polymers. A crosslinkable functional group may be introduced by copolymerization.

As the examples of polymers having an ethylenic unsaturated bond in the main chain of the molecule, poly-1,4-butadiene and poly-1,4-isoprene are exemplified.

As the examples of polymers having an ethylenic unsaturated bond in the side chain of the molecule, polymers of acrylic or methacrylic esters or acrylic acid amides or methacrylic acid amides, wherein the residue of the ester or amide (R of —COOR or —CONHR) has an ethylenic unsaturated bond are exemplified.

The examples of the residues having an ethylenic unsaturated bond (the above-described R) include $-(CH_2)_n CR^1{=}CR^2R^3$, $-(CH_2O)_nCH_2CR^1{=}CR^2R^3$, $-(CH_2CH_2O)_nCH_2CR^1{=}CR^2R^3$, $-(CH_2)_nNH-CO-O-CH_2CR^1{=}CR^2R^3$, $-(CH_2)_n-O-CO-CR^2R^3$ and $(CH_2CH_2O)_2-X$ (wherein $R^1$, $R^2$ and $R^3$ each represents a hydrogen atom, a halogen atom, an alkyl group having from 1 to 20 carbon atoms, an aryl group, an alkoxyl group or an aryloxy group, and $R^1$ and $R^2$ or $R^3$ may be bonded to each other to form a ring, n represents an integer of from 1 to 10, and X represents a dicyclopentadienyl residue).

The specific examples of ester residues include $-CH_2CH{=}CH_2$ (disclosed in JP-B-7-21633), —$CH_2CH_2O$—$CH_2CH$═$CH_2$, —$CH_2C(CH_3)$═$CH_2$, —$CH_2CH$═CH—$C_6H_5$, —$CH_2CH_2OCOCH$═CH—$C_6H_5$, —$CH_2CH_2$—NHCOO—$CH_2CH$═$CH_2$ and $CH_2CH_2O$—X (wherein X represents a dicyclopentadienyl residue).

The examples of amido residues include —$CH_2CH$═$CH_2$, —$CH_2CH_2$—Y (wherein Y represents a cyclohexene residue), and —$CH_2CH_2$—OCO—CH═$CH_2$.

When free radicals (polymerization initiation radicals or the grown radicals of a polymerizable compound in the polymerization process) are added to the crosslinkable functional groups of a binder polymer having a crosslinking property, addition polymerization occurs directly between the polymers or via the polymerization chains of the polymerizable compound, as a result, crosslinking is formed between the molecules of the polymers and the binder polymer is hardened. Alternatively, the atoms in the polymer (e.g., the hydrogen atoms on the carbon atoms contiguous to crosslinkable functional groups) are extracted by free radicals and polymer radicals are grown, the polymer radicals are bonded to each other, whereby crosslinking is formed between the polymer molecules, so that the binder polymer is hardened.

The amount of crosslinkable groups contained in a binder polymer (the amount contained of radical polymerizable unsaturated double bonds by the iodometric titration method) is preferably from 0.1 to 10.0 mmol per gram of the binder polymer, more preferably from 1.0 to 7.0 mmol, and most preferably from 2.0 to 5.5 mmol. When the amount of crosslinkable groups is in this range, good sensitivity and good storage stability can be obtained.

From the viewpoint of the improvement of the on-press developing properties, it is preferred that binder polymers have high solubility and dispersibility in ink and/or a fountain solution.

For improving the solubility and dispersibility in ink, binder polymers are preferably lipophilic, and for improving the solubility and dispersibility in a fountain solution, binder polymers are preferably hydrophilic. Accordingly, in the present invention, it is also effective to use a lipophilic binder polymer and a hydrophilic binder polymer in combination.

As hydrophilic binder polymers, binder polymers having a hydrophilic group, e.g., a hydroxyl group, a carboxyl group, a carboxylate group, a hydroxyethyl group, a polyoxyethyl group, a hydroxypropyl croup, a polyoxypropyl group, an amino group, an aminoethyl group, an aminopropyl group, an ammonium group, an amido group, a carboxymethyl group, a sulfonic acid group and a phosphoric acid group are preferably exemplified.

The specific examples of hydrophilic binder polymers include gum arabic, casein, gelatin, starch derivatives, carboxymethyl cellulose and a sodium salt of carboxymethyl cellulose, cellulose acetate, sodium alginate, vinyl acetate-maleic acid copolymers, styrene-maleic acid copolymers, polyacrylic acids and the salts of them, polymethacrylic acids and the salts of them, homopolymers and copolymers of hydroxyethyl methacrylate, homopolymers and copolymers of hydroxyethyl acrylate, homopolymers and copolymers of hydroxypropyl methacrylate, homopolymers and copolymers of hydroxypropyl acrylate, homopolymers and copolymers of hydroxybutyl methacrylate, homopolymers and copolymers of hydroxybutyl acrylate, polyethylene glycols, hydroxypropylene polymers, polyvinyl alcohols, hydrolyzed polyvinyl acetate having a hydrolysis degree of 60 wt % or more, preferably 80 wt % or more, polyvinyl formal, polyvinyl butyral, polyvinyl pyrrolidone, homopolymers and copolymers of acrylamide, homopolymers and polymers of methacrylamide, homopolymers and copolymers of N-methylolacrylamide, polyvinyl pyrrolidone, alcohol-soluble nylon, and polyether of 2,2-bis(4-hydroxyphenyl)propane and epichlorohydrin.

Binder polymers preferably have a weight average molecular weight of preferably 5,000 or higher, more preferably from 10,000 to 300,000, and a number average molecular weight of preferably 1,000 or higher, more preferably from 2,000 to 250,000. The polydisperse degree (weight average molecular weight/number average molecular weight) is preferably from 1.1 to 10.

Binder polymers may be any of a random polymer and a block polymer but a random polymer is preferred. Binder polymers may be used alone, or two or more may be mixed.

Binder polymers can be synthesized by well-known methods. As the solvents for use in the synthesis, e.g., tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethylformamide, N,N-dimethylacetamide, toluene, ethyl acetate, methyl lactate, ethyl lactate, dimethyl sulfoxide, and water are exemplified. These solvents may be used alone or two or more solvents may be used as a mixture.

As the radical polymerization initiators used in the synthesis of binder polymers, well known compounds, e.g., azo initiators and peroxide initiators can be used.

<Surfactant>

In the present invention, it is preferred to use a surfactant in an image-recording layer to accelerate the on-press development property at the time of initiating printing and to improve the conditions of coating surface. As the surfactants for these purposes, nonionic surfactants, anionic surfactants, cationic surfactants, ampholytic surfactants and fluorine surfactants are used. Surfactants may be used alone or two or more surfactants may be used in combination.

The nonionic surfactants for use in the invention are not particularly restricted and conventionally well known surfactants can be used, e.g., polyoxyethylene alkyl ethers, polyoxyethylene alkyl phenyl ethers, polyoxyethylene polystyryl phenyl ethers, polyoxyethylene polyoxypropylene alkyl ethers, glycerol fatty acid partial esters, sorbitan fatty acid partial esters, pentaerythritol fatty acid partial esters, propylene glycol monofatty acid esters, sucrose fatty acid partial esters, polyoxyethylene sorbitan fatty acid partial esters, polyoxyethylene sorbitol fatty acid partial esters, polyethylene glycol fatty acid esters, polyglycerol fatty acid partial esters, polyoxyethylenated castor oils, polyoxyethylene glycerol fatty acid partial esters, fatty acid diethanolamides, N,N-bis-2-hydroxyalkylamines, polyoxyethylene alkylamine, triethanolamine fatty acid ester, trialkylamine oxide, polyethylene glycol, and copolymers of polyethylene glycol and polypropylene glycol are exemplified.

The anionic surfactants for use in the invention are not particularly restricted and conventionally well known surfactants can be used, e.g., fatty acid salts, abietates, hydroxyalkanesulfonates, alkanesulfonates, dialkylsulfosuccinic esters, straight chain alkylbenzenesulfonates, branched chain alkylbenzenesulfonates, alkylnaphthalene-sulfonates, alkylphenoxy polyoxyethylene propyl sulfonates, polyoxyethylene alkyl sulfophenyl ethers, sodium N-methyl-N-oleyltaurine, disodium N-alkylsulfosuccinic acid monoamide, petroleum sulfonates, sulfated beef tallow, sulfuric esters of fatty acid alkyl ester, alkylsulfuric esters, polyoxyethylene alkyl ether sulfuric esters, fatty acid monoglyceride sulfuric esters, polyoxyethylene alkyl phenyl ether sulfuric esters, polyoxyethylene styryl phenyl ether sulfuric esters, alkylphosphoric esters, polyoxyethylene alkyl ether phosphoric esters, polyoxyethylene alkyl phenyl ether phosphoric esters, partial saponification products of styrene/maleic anhydride copolymers, partial saponification products of olefin/maleic anhydride copolymers, and naphthalene sulfonate formaldehyde condensation products are exemplified.

The cationic surfactants for use in the invention are not particularly restricted and conventionally well known surfactants can be used, e.g., alkylamine salts, quaternary ammonium salts, polyoxyethyene alkylamine salts, and polyethylene polyamine derivatives are exemplified.

The amphoteric surfactants for use in the invention are not particularly restricted and conventionally well known surfactants can be used, e.g., carboxybetaines, amino-carboxylic acids, sulfobetaines, aminosulfuric esters and imidazolines are exemplified.

In the above surfactants, “polyoxyethylene” can be taken as “polyoxyalkylene” such as polyoxymethylene, polyoxypropylene, or polyoxybutylene, and these surfactants can also be used in the invention.

As more preferred surfactants, fluorine surfactants containing a perfluoroalkyl group in the molecule are exemplified. As such surfactants, anionic surfactants, e.g., perfluoroalkylcarboxylate, perfluoroalkylsulfonate, and perfluoroalkylphosphate; amphoteric surfactants, e.g., perfluoroalkylbetaine; cationic surfactants, e.g., perfluoroalkyltrimethylammonium salt; and nonionic surfactants, e.g., perfluoroalkylamine oxide, perfluoroalkyl ethylene oxide addition product, oligomers containing a perfluoroalkyl group and a hydrophilic group, oligomers containing a perfluoroalkyl group and a lipophilic group, oligomers containing a perfluoroalkyl group, a hydrophilic group, and a lipophilic group, and urethane containing a perfluoroalkyl group and a lipophilic group are exemplified. Further, the fluorine surfactants disclosed in JP-A-62-170950, JP-A-62-226143 and JP-A-60-168144 are also preferably used.

Surfactants can be used alone, or two or more surfactants can be used in combination.

Surfactants are preferably used in an amount of from 0.001 to 10 wt % to the total solids content of the image recording layer, more preferably from 0.01 to 7 wt %.

<Colorant>

Further, if necessary, various compounds besides the above compounds can be used in the present invention. For example, dyes having large absorption in the visible ray region can be used as the colorants of images. Specifically, Oil Yellow #101, Oil Yellow #103, Oil Pink #312, Oil Green BG, Oil Blue BOS, Oil Blue #603, Oil Black BY, Oil Black BS, Oil Black T-505 (products of Orient Chemical Industry Co., Ltd.), Victoria Pure Blue, Crystal Violet (C.I. 42555), Methyl Violet (C.I. 42535), Ethyl Violet, Rhodamine B (C.I. 145170B), Malachite Green (C.I. 42000), Methylene Blue (C.I. 52015), and the dyes disclosed in JP-A-62-293247 can be exemplified. In addition, pigments such as phthalocyanine pigments, azo pigments, carbon black and titanium oxide are also preferably used.

These colorants are preferably added to discriminate an image area from a non-image area after image formation. The addition amount of colorants is preferably from 0.01 to 10 wt % to the total solids content in the image recording layer.

<Print-out Agent>

Compounds that discolor by acid or radical can be added to an image-recording layer in the invention for forming a print out images. As such compounds, various dyes, e.g., diphenylmethane, triphenylmethane, thiazine, oxazine, xanthene, anthraquinone, iminoquinone, azo and azomethine dyes are effectively used.

The specific examples of such dyes include Brilliant Green, Ethyl Violet, Methyl Green, Crystal Violet, Basic Fuchsine, Methyl Violet 2B, Quinaldine Red, Rose Bengal, Metanil Yellow, Thymolsulfophthalein, Xylenol Blue, Methyl Orange, Paramethyl Red, Congo Red, Benzopurpurin 4B, α-Naphthyl Red, Nile Blue 2B, Nile Blue A, Methyl Violet, Malachite Green, Parafuchsine, Victoria Pure Blue BOH (manufactured by HODOGAYA CHEMICAL Co., Ltd.), Oil Blue #603 (manufactured by Orient Chemical Industry Co., Ltd.), Oil Pink #312 (manufactured by Orient Chemical Industry Co., Ltd.), Oil Red 5B (manufactured by Orient Chemical Industry Co., Ltd.), Oil Scarlet #308 (manufactured by Orient Chemical Industry Co., Ltd.), Oil Red OG (manufactured by Orient Chemical Industry Co., Ltd.), Oil Red RR (manufactured by Orient Chemical Industry Co., Ltd.), Oil Green #502 (manufactured by Orient Chemical Industry Co., Ltd.), Spiron Red BEH Special (manufactured by HODOGAYA CHEMICAL Co., Ltd.), m-Cresol Purple, Cresol Red, Rhodamine B, Rhodamine 6G, Sulforhodamine B, Auramine, 4-p-diethylaminophenyliminonaphthoquinone, 2-carboxyamino-4-p-diethylaminophenyliminonaphthoquinone, 2-carboxystearylamino-4-p-N,N-bis(hydroxyethyl)amino-phenyliminonaphthoquinone, 1-phenyl-3-methyl-4-p-diethylaminophenylimino-5-pyrazolone, and 1-β-naphthyl-4-p-diethylaminophenylimino-5-pyrazolone, and leuco dyes such as p,p',p''-hexamethyltriaminotriphenylmethane (Leuco Crystal Violet), Pergascript Blue SIR (manufactured by Ciba Geigy A.G).

In addition to the above, leuco dyes known as the materials of heat-sensitive paper and pressure-sensitive paper are also preferred. The specific examples of the leuco dyes include Crystal Violet Lactone, Malachite Green Lactone, Benzoyl Leuco Methylene Blue, 2-N-phenyl-N-methylamino)-6-(N-p-tolyl-N-ethyl)aminofluoran, 2-anilino-3-methyl-6-N-ethyl-p-toluidino)fluoran, 3,6-dimethoxyfluoran, 3-(N,N-diethylamino)-5-methyl-7-(N,N-dibenzylamino)fluoran, 3-(N-cyclohexyl-N-methylamino)-6-methyl-7-anilinofluoran, 3-(N,N-diethylamino)-6-methyl-7-anilinofluoran, 3-(N,N-diethylamino)-6-methyl-7-xylidinofluoran, 3-(N,N-diethyl-amino)-6-methyl-7-chlorofluoran, 3-(N,N-diethylamino)-6-methoxy-7-aminofluoran, 3-(N,N-diethylamino)-7-(4-chloroanilino) fluoran, 3-(N,N-diethylamino)-7-chlorofluoran, 3-(N,N-diethylamino)-7-benylaminofluoran, 3-(N,N-diethylamino)-7,8-benzofluoran, 3-(N,N-dibutylamino)-6-methyl-7-anilinofluoran, 3-(N,N-dibutylamino)-6-methyl-7-xylidinofluoran, 3-piperidino-6-methyl-7-anilinofluoran, 3-pyrrolidino-6-methyl-7-anilinofluoran, 3,3-bis(1-ethyl-2-methylindol-3-yl)-phthalide, 3,3-bis(1-n-butyl-2-methyl-indol-3-yl)-phthalide, 3,3-bis(p-dimethylaminophenyl)-6-dimethylaminophthalide, 3-(4-diethylamino-2-ethoxyphenyl)-3-(1-ethyl-2-methylindol-3-yl)-4-phthalide, and 3-(4-diethylaminophenyl)-3-(1-ethyl-2-methylindol-3-yl)-phthalide.

The preferred addition amount of the dyes that discolor by acid or radical is from 0.01 to 10 wt % to the solids content in the image recording layer.

<Polymerization Inhibitor>

For preventing unnecessary thermal polymerization of a radical polymerizable compound during manufacture or preservation of an image-recording layer, it is preferred that a small amount of thermal polymerization inhibitor be added to an image-recording layer in the invention.

As the thermal polymerization inhibitors, e.g., hydroquinone, p-methoxyphenol di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), and N-nitroso-N-phenylhydroxylamine aluminum salt are exemplified.

The amount of the thermal polymerization inhibitor to be added to an image-recording layer is preferably from about 0.01 to about 5 wt % to the total solids content of the image recording layer.

<Higher Fatty Acid Derivative, etc.>

For preventing the polymerization hindrance due to oxygen, higher fatty acid derivatives, e.g., behenic acid and behenic acid amide, may be added to an image-recording layer in the invention and locally exist on the surface of the image-recording layer in the drying process after coating. The addition amount of the higher fatty acid derivatives is preferably from about 0.1 to about 10 wt % to the total solids content of the image-recording layer.

<Plasticizer>

An image-recording layer in the present invention may contain a plasticizer to improve on-press developing properties.

The examples of plasticizers include phthalic esters, e.g., dimethyl phthalate, diethyl phthalate, dibutyl phthalate, diisobutyl phthalate, dioctyl phthalate, octylcapryl phthalate, dicyclohexyl phthalate, ditridecyl phthalate, butylbenzyl phthalate, diisodecyl phthalate, and diallyl phthalate; glycol esters, e.g., dimethyl glycol phthalate, ethyl phthalyl ethyl glycolate, methyl phthalyl ethyl glycolate, butyl phthalyl butyl glycolate, and triethylene glycol dicaprylate; phosphoric esters, e.g., tricresyl phosphate and triphenyl phosphate; aliphatic dibasic esters, e.g., diisobutyl adipate, dioctyl adipate, dimethyl sebacate, dibutyl sebacate, dioctyl azelate, and dibutyl maleate, and polyglycidyl methacrylate, triethyl citrate, glycerol triacetyl ester and butyl laurate.

The amount of plasticizers is preferably about 30 wt % or less to the total solids content of the image recording layer.

<Inorganic Fine Particles>

An image-recording layer in the invention may contain inorganic fine particles for the purposes of increasing the strength of the hardened film of an image area, and improving the on-press developing properties of a non-image area.

As the inorganic fine particles, e.g., silica, alumina, magnesium oxide, titanium oxide, magnesium carbonate, calcium alginate and mixtures of these fine particles are preferably used. These inorganic fine particles can be used for strengthening a film and strengthening an interface adhesion property by surface roughening treatment even when they are not light-heat convertible.

The average particle size of these inorganic fine particles is preferably from 5 nm to 10 μm, more preferably from 0.5 to 3 μm. When the average particle size is in this range, inorganic fine particles are stably dispersed in the image-recording layer and the film strength of the image-recording layer can be sufficiently retained, thus a non-image area difficult to be soiled in printing and excellent in hydrophilicity can be formed.

These inorganic fine particles are easily available as commercial products of colloidal silica dispersion and the like.

The addition amount of inorganic fine particles is preferably 20 wt % or less to the total solids content of the image-recording layer, more preferably 10 wt % or less.

<Low Molecular Weight Hydrophilic Compound>

For the improvement of an on-press developing property, an image-recording layer in the invention may contain hydrophilic low molecular weight compounds. As the hydrophilic low molecular weight compounds, water-soluble organic compounds, such as glycols, e.g., ethylene glycol, diethylene glycol, triethylene glycol, propylene glycol, dipropylene glycol, and tripropylene glycol, and ether or ester derivatives of these glycols, polyhydroxies, e.g., glycerol and pentaerythritol, organic amines, e.g., triethanolamine, diethanolamine and monoethanolamine, and salts of these organic amines, organic sulfonic acids, e.g., toluenesulfonic acid and benzenesulfonic acid, and salts of these organic sulfonic acids, organic phosphonic acids, e.g., phenyl-phosphonic acid, and salts of organic phenylphosphonic acids, and organic carboxylic acids, e.g., tartaric acid, oxalic acid, citric acid, malic acid, lactic acid, gluconic acid and amino acid, and salts of these organic carboxylic acids are exemplified.

Formation of Image-recording Layer:

For adding the above constitutional components of an image-recording layer to an image-recording layer, some methods can be used. One is a method of dissolving the constitutional components in a proper solvent and coating as disclosed in JP-A-2002-287334. Another method is a method of encapsulating the constitutional components of an image recording layer in microcapsules and adding to an image recording layer (a microcapsule type image-recording layer) as disclosed in JP-A-2001-277740 and JP-A-2001-277742. In a microcapsule type image-recording layer, an image-recording layer can contain the constitutional components out of microcapsules. In a microcapsule type image-recording layer, it is preferred to contain hydrophobic constitutional components in microcapsules and hydrophilic constitutional components out of microcapsules. For obtaining better on-press developing properties, it is advantageous to use a microcapsule type image-recording layer.

The constitutional components of an image-recording layer can be microencapsulated by well-known methods. For example, as the manufacturing method of microcapsules, a method making use of coacervation as disclosed in U.S. Pat. Nos. 2,800,457 and 2,800,458, an interfacial polymerization method as disclosed in U.S. Pat. No. 3,287,154, JP-B-38-19574 and JP-B-42-446, a method by the precipitation of a polymer as disclosed in U.S. Pat. Nos. 3,418,250 and 3,660,304, a method of using isocyanate polyol wall materials as disclosed in U.S. Pat. No. 3,796,669, a method of using isocyanate wall materials as disclosed in U.S. Pat. No. 3,914,511, a method of using urea-formaldehyde series or urea-formaldehyde-resorcinol series wall materials as disclosed in U.S. Pat. Nos. 4,001,140, 4,087,376 and 4,089,802, a method of using wall materials such as melamine-formaldehyde resins and hydroxy cellulose as disclosed in U.S. Pat. No. 4,025,445, a monomer polymerization in situ method as disclosed in JP-B-36-9163 and JP-B-51-9079, a spray drying method as disclosed in British Patent 930,422 and U.S. Pat. No. 3,111,407, and an electrolytic dispersion cooling method as disclosed in British Patents 952,807 and 967,074 can be exemplified, but the invention is not limited to these methods.

The microcapsule walls preferably used in the invention have three dimensional crosslinking and a property of swelling by a solvent. From this point of view, polyurea, polyurethane, polyester, polycarbonate, polyamide, and the mixtures of these compounds are preferably used as microcapsule wall materials, and polyurea and polyurethane are particularly preferred. Compounds having crosslinkable functional groups such as ethylenic unsaturated bonds that can be used in the above binder polymers may be introduced into a microcapsule wall.

The average particle size of the microcapsules is preferably from 0.01 to 3.0 μm, more preferably from 0.05 to 2.0 μm, and particularly preferably from 0.10 to 1.0 μm. Good resolution and aging stability can be obtained in this range of particle size.

An image-recording layer in the invention is formed by coating a coating solution prepared by dispersing or dissolving the above necessary constitutional components. As solvents used here, ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethyl-formamide, tetramethylurea, N-methylpyrrolidone, dimethyl sulfoxide, sulforan, γ-butyrolactone, toluene, and water are exemplified, but solvents are not limited thereto. These solvents are used alone or as mixture. The concentration of the solid contents of a coating solution is preferably from 1 to 50 wt %.

It is also possible to form an image-recording layer in the invention by preparing a plurality of coating solutions by dispersing or dissolving the same or different components in the same or different solvents, and repeating the coating and drying a plurality of times.

Although the coating amount of an image-forming layer (solids content) on a support obtained after coating and drying varies according to uses, it is generally preferably from 0.3 to 3.0 $g/m^2$. When the coating amount is in this range, good sensitivity and good film properties of an image-recording layer can be obtained.

Various coating methods can be used. For example, bar coating, rotary coating, spray coating, curtain coating, dip coating, air knife coating, blade coating, and roll coating can be used.

<Support>

Supports for use in the lithographic printing plate precursor of the invention are not particularly limited and any materials can be used so long as they are dimensionally stable and plate-like materials. For example, paper, paper laminated with plastics (e.g., polyethylene, polypropylene, polystyrene, etc.), metal plates (e.g., aluminum, zinc, copper, etc.), plastic films (e.g., cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, polyvinyl acetal, etc.), and paper and plastic films laminated or deposited with the above metals can be exemplified as the materials of the support. Preferred supports are a polyester film and an aluminum plate. Above all, aluminum plates, which are dimensionally stable and comparatively inexpensive, are preferred.

Aluminum plates are a pure aluminum plate, alloy plates containing aluminum as a main component and a trace amount of different elements, and aluminum or aluminum alloy thin films laminated with plastics. The examples of different elements contained in aluminum alloys include silicon, iron, manganese, copper, magnesium, chromium, zinc, bismuth, nickel, titanium, etc. The different element content in aluminum alloys is preferably 10 wt % or less. In the invention, a pure aluminum plate is preferred but 100% pure aluminum is difficult to produce from the refining technique, accordingly, an extremely small amount of different elements may be contained. Thus, the compositions of aluminum plates used in the invention are not specified, and conventionally well known and commonly used materials can be optionally used.

A support for use in the invention has a thickness of preferably from 0.1 to 0.6 mm, more preferably from 0.15 to 0.4 mm, and still more preferably from 0.2 to 0.3 mm.

Prior to the use of an aluminum plate, it is preferred to perform surface treatment, e.g., surface roughening treatment and anodizing treatment. By performing surface treatment, the improvement of hydrophilicity and the security of the adhesion of an image-recording layer and a support become easy. Prior to the surface roughening treatment of an aluminum plate, if necessary, degreasing treatment with a surfactant, an organic solvent or an alkaline aqueous solution is carried out to remove the rolling oil on the surface of an aluminum plate.

Surface roughening treatment of the surface of an aluminum plate is performed by various methods, e.g., mechanical surface roughening treatment, electrochemical surface roughening treatment (surface roughening treatment of electrochemically dissolving the surface), and chemical surface roughening treatment (surface roughening treatment of chemically selectively dissolving the surface) are exemplified.

As the method of mechanical surface roughening treatment, well-known methods, e.g., a ball rubbing method, a brush abrading method, a blast abrading method, or a buffing method, can be used.

As the method of electrochemical surface roughening treatment, a method of roughening an aluminum plate in an electrolyte containing an acid such as a hydrochloric acid or a nitric acid by alternating current or direct current can be used. Further, a method of using mixed acids can be used as disclosed in JP-A-54-63902.

The aluminum plate subjected to surface roughening treatment is, if necessary, subjected to alkali etching treatment with an aqueous solution of potassium hydroxide or sodium hydroxide and neutralizing treatment and then, if necessary, to anodizing treatment to increase the abrasion resistance of the surface.

Various electrolytes can be used in the anodizing treatment of an aluminum plate for forming porous oxide film, and sulfuric acid, hydrochloric acid, oxalic acid, chromic acid and mixed acids of these acids are generally used. The concentrations of these electrolytes are arbitrarily determined according to the kinds of electrolytes.

Anodizing treatment conditions vary according to electrolytes used and cannot be specified unconditionally, but in general preferably the concentration of an electrolytic solution is from 1 to 80 wt %, the liquid temperature is from 5 to 70° C., the electric current density is from 5 to 60 $A/dm^2$, the voltage is from 1 to 100 V, electrolytic time is from 10 seconds to 5 minutes. The amount of the anodic oxide film formed is preferably from 1.0 to 5.0 $g/m^{2\prime}$ more preferably from 1.5 to 4.0 $g/m^2$. In this range of the amount of the anodic oxide film, good press life and good scratch resistance of the non-image area of a lithographic printing plate can be obtained.

After anodizing treatment, if necessary, the surface of the aluminum plate is subjected to hydrophilization treatment. As the hydrophilization treatment, alkali metal silicate methods as disclosed in U.S. Pat. Nos. 2,714,066, 3,181,461, 3,280,734 and 3,902,734 are known. These are methods of immersing a support in an aqueous solution of sodium silicate, or electrolytically treating. Besides these methods, a method of treating a support with a potassium fluorozirconate as disclosed in JP-B-36-22063, and a method of treating a support with a polyvinyl phosphonic acid as disclosed in U.S. Pat. Nos. 3,276,868, 4,153,461 and 4,689,272 are exemplified.

A support preferably has central line average surface roughness of from 0.10 to 1.2 μm. In this range of surface roughness, good adhesion of a support with an image-recording layer, good press life and good soiling resistance can be obtained.

As the color density of a support, from 0.15 to 0.65 in a reflection density value is preferred. In this range of color density, good image forming property due to prevention of halation at image exposure and good detecting property of the printing plate after development can be obtained.

<Back Coat>

After surface treatment of a support or after forming an undercoat layer, if necessary, a back coat can be provided on the back surface of the support.

As the back coat, e.g., coating layers comprising organic polymer compounds as disclosed in JP-A-5-45885, and coating layers comprising metallic oxides obtained by hydrolysis and polycondensation of organic or inorganic metallic compounds as disclosed in JP-A-6-35174 are preferably used. Alkoxy compounds of silicon, e.g., $Si(OCH_3)_4$, $Si(OC_2H_5)_4$, $Si(OC_3H_7)_4$, $Si(OC_4H_9)_4$ are preferably used for the inexpensiveness and easy availability of the materials.

[Undercoat Layer]

In a lithographic printing plate precursor for use in a lithographic printing method of the invention, if necessary, an undercoat layer can be provided between an image-recording layer and a support. Since the undercoat layer functions as a heat-insulating layer, the heat generated by infrared laser exposure does not diffuse to the support and is efficiently utilized, so that the improvement of sensitivity can be contrived. Further, the image-recording layer comes to be easily peeled off the support at unexposed area, so that on-press developing properties are improved.

As the undercoat layer, specifically the silane coupling agent having an addition polymerizable ethylenic double bond reactive group disclosed in JP-A-10-282679, and phosphorus compounds having an ethylenic double bond reactive group are preferred.

The coating amount of an undercoat layer (solids content) is preferably from 0.1 to 100 mg/m$^2$, more preferably from 3 to 30 mg/m$^2$.

[Protective Layer]

In a lithographic printing plate precursor for use in a lithographic printing method of the invention, for preventing the generation of scratches on an image recording layer, for shielding oxygen, and for preventing ablation at the time of exposure with high intensity laser, if necessary, a protective layer may be provided on an image recording layer.

Exposure is generally performed in the air in the present invention, and the protective layer prevents the mixture of low molecular weight compounds into the image recording layer, e.g., oxygen and basic substance in the air that hinder the image-forming reaction generated in the image recording layer by exposure, by which the hindrance of the image-forming reaction by exposure in the air can be prevented. Accordingly, the characteristics required of the protective layer are to be low in permeability of low molecular weight compounds such as oxygen, good in transmission of light used for exposure, excellent in adhesion with an image-recording layer, and capable of being removed easily by on-press development after exposure. Protective layers having such characteristics have so far been variously examined and they are disclosed in detail, e.g., in U.S. Pat. No. 3,458,311 and JP-A-55-49729.

As the materials that are used for the protective layer, for example, water-soluble polymer compounds relatively excellent in crystallizability are exemplified. Specifically, water-soluble polymers, e.g., polyvinyl alcohol, polyvinyl pyrrolidone, acid celluloses, gelatin, gum arabic, and polyacrylic acid are exemplified. Above all, when polyvinyl alcohol (PVA) is used as the main component, the best results can be given to the fundamental characteristics such as an oxygen-shielding property and the removal by development. Polyvinyl alcohols may be partially substituted with ester, ether or acetal, or may partially contain other copolymer components so long as they contain an unsubstituted vinyl alcohol unit for imparting an oxygen-shielding property and solubility in water that are necessary to the protective layer.

As the specific examples of polyvinyl alcohols, those having a hydrolyzed rate of from 71 to 100 mol % and the degree of polymerization of from 300 to 2,400 are preferably exemplified. Specifically, PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217BE, PVA-217E, PVA-220E, PVA-224E, PVA-405, PVA-420, PVA-613, and L-8 (manufactured by Kuraray Co., Ltd.) are exemplified.

The components of the protective layer (the selection of PVA, the use of additives, etc.), and the coating amounts are suitably selected by considering fogging characteristic, an adhesion property and scratch resistance besides the oxygen shielding property and the removal by development. In general, the higher the hydrolyzing rate of PVA (that is, the higher the unsubstituted vinyl alcohol unit content in the protective layer), and the higher the layer thickness, the higher is the oxygen-shielding property, so that advantageous in the point of sensitivity. Moreover, for the prevention of the generation of unnecessary polymerization reaction during manufacture and storage, or the generation of unnecessary fog at image exposure and thickening of image lines, it is preferred that the oxygen-permeating property is not too high. Therefore, oxygen permeability A at 25° C. under 1 atm is preferably, $0.2 \leqq A \leqq 20$ (ml/m$^2$·day).

As other components of the protective layer, glycerol, dipropylene glycol and the like can be added in several wt % equivalent to the water-soluble polymer compounds to provide flexibility, and further, anionic surfactants, e.g., sodium alkylsulfate and sodium alkylsulfonate; ampholytic surfactants, e.g., alkylaminocarboxylate and alkylaminodicarboxylate; and nonionic surfactants, e.g., polyoxy-ethylene alkyl phenyl ether, can be added to the (co)polymers each in an amount of several wt %.

The layer thickness of the protective layer is preferably from 0.1 to 5 μm, particularly preferably from 0.2 to 2 μm.

The adhesion property of the protective layer with an image area and scratch resistance are also very important in treating a lithographic printing plate precursor. That is, when a protective layer that is hydrophilic by containing a water-soluble polymer compound is laminated on a lipophilic image-recording layer, layer peeling of the protective layer due to insufficient adhesion is liable to occur, and sometimes a defect such as film hardening failure attributing to polymerization hindrance by oxygen is caused at the peeled part.

Various countermeasures have been proposed for improving the adhesion of an image-recording layer and a protective layer. For example, it is disclosed in JP-A-49-70702 and unexamined published British Patent Application No. 1,303,578 that sufficient adhesion can be obtained by mixing from 20 to 60 wt % of an acryl-based emulsion or a water-insoluble vinyl pyrrolidone/vinyl acetate copolymer with a hydrophilic polymer mainly comprising polyvinyl alcohol and laminating the resulting product on an image-recording layer. Any of these well-known techniques can be used in the present invention. The coating methods of a protective layer are disclosed in detail, e.g., in U.S. Pat. No. 3,458,311 and JP-A-55-49729.

Further, other functions can be imparted to a protective layer. For example, by the addition of colorants excellent in transmission of infrared rays that are used in exposure and capable of efficiently absorbing lights of other wavelengths (e.g., water-soluble dyes), safelight aptitude can be improved without causing sensitivity reduction.

[Exposure]

In a lithographic printing method of the invention, the above-described lithographic printing plate precursor is imagewise exposed with an infrared laser.

The infrared lasers for use in the present invention are not particularly restricted, but solid state lasers and semiconductor lasers radiating infrared rays of the wavelengths of from 760 to 1,200 nm are preferably used. The output of infrared lasers is preferably 100 mW or higher. It is preferred to use a multi-beam laser device for expediting exposure.

The exposure time per a pixel is preferably not longer than 20 μsec. The quantity of irradiation energy is preferably from 10 to 300 mJ/$cm^2$.

[Printing Method]

In a lithographic printing method of the invention, as described above, after being subjected to imagewise exposure with infrared laser beams, the lithographic printing plate precursor in the invention is used in lithographic printing by feeding oily ink and an aqueous component without undergoing any development process.

Specifically, a method of subjecting a lithographic printing plate precursor to infrared laser exposure, and then mounting the exposed printing plate precursor on a printing press without undergoing development process and perform printing, and a method of mounting a lithographic printing plate precursor on a printing press, and then exposing the printing plate precursor with infrared laser beams on the printing press, and perform printing without subjecting to development process are exemplified.

When a lithographic printing plate precursor is imagewise exposed with infrared laser beams and printing is performed by feeding an aqueous component and oily ink without being subjected to development process such as wet development process, the image-recording layer hardened by exposure forms an oil ink-accepting area having a lipophilic surface at the exposed area of the image-recording layer, On the other hand, at the unexposed area, an unhardened image-recording layer is dissolved or dispersed with the supplied aqueous component and/or oil ink and removed, whereby a hydrophilic surface is bared at that area.

As a result, the aqueous component adheres to the bared hydrophilic surface, the oil ink adheres to the image recording layer in the exposed area, and printing is initiated. Here, the one supplied first to the printing plate may be oil ink or may be an aqueous component, but for preventing the aqueous component from becoming ditty by the image-recording layer at the unexposed area, it is preferred to feed oil ink in the first place. As the aqueous component and the oil ink, fountain solutions and oily inks for ordinary lithographic printing are used.

In this manner, a lithographic printing plate precursor is subjected to on-press development on an offset printer and used in printing of a plenty of sheets.

EXAMPLE

The present invention is described in detail below with reference to examples, but the invention is not limited thereto.

<Synthesis of Graft Polymer (A-1) Having Hydrophilic Segment as a Graft Chain>

Synthesis of Hydrophilic Macromer:

Acrylamide (30 g) aid 3.8 g of 3-mercaptopropionic acid were dissolved in 70 g of ethanol, the temperature was raised to 60° C. under a nitrogen atmosphere, and 300 mg of a thermal polymerization initiator 2,2'-azobisisobutyronitrile (AIBN) was added thereto and the reaction system was allowed to react for 6 hours. After the reaction, a white precipitate was filtered and thoroughly washed, whereby 30.8 g of a prepolymer having carboxylic acids at terminals was obtained (the carboxylic acid value: 0.78 meq/g, the weight average molecular weight: $1.3\times10^3$).

The obtained prepolymer (20 g) was dissolved in 62 g of N,N-dimethylacetamide, thereto were added 6.71 g of glycidyl methacrylate, 504 mg of N,N-dimethyldodecylamine (a catalyst) and 62.4 mg of hydroquinone (a polymerization inhibitor), and the temperature was raised to 130° C. and the solution was allowed to react for 6 hours. After the reaction, the obtained reaction product was put into acetone to precipitate a polymer, and the polymer was thoroughly washed, whereby 23.4 g of acrylamide macromonomer having methacrylate at terminals was obtained. (The weight average molecular weight: $14\times10^3$). From $^1$H-NMR ($D_2O$) 6.12, 5.70 ppm, the existence of the olefin peak of a methacryloyl group and the reduction of the carboxylic acid value (0.023 meq/g), the introduction of the polymerizable group to the terminals was confirmed. The glass transition temperature of the hydrophilic macromer measured with a differential scanning calorimeter (DSC) (manufactured by Seiko Instruments Inc.) was 160° C.

Synthesis of Graft Polymer:

N,N-Dimethylacetamide (15 g) was put into a flask and the temperature was raised to 60° C. under a nitrogen atmosphere. A solution obtained by dissolving 10 g of the above-obtained macromer, 5 g of methyl methacrylate, and 150 mg of a thermal polymerization initiator 2,2'-azobisisobutyronitrile in 15 g of N,N-dimethylacetamide was dripped to the flask over 2 hours. After completion of dripping, the reaction solution was continuously heated for 6 hours. The product was precipitated and thoroughly washed, whereby 14.5 g of graft polymer (A-1) having a hydrophobic segment as the graft chain was obtained. The weight average molecular weight is shown in Table 1 below.

<Synthesis of Graft Polymers (A-2) to (A-5) Having Hydrophilic Segment as a Graft Chain>

Each of graft polymers (A-2) to (A-5) was synthesized in the same manner as the synthesis of graft polymer (A-1) except that the hydrophobic monomer (methyl methacrylate) in the above synthesis example was changed as shown Table 1 below. The weight average molecular weight of each graft polymer is shown in Table 1.

TABLE 1

Graft Polymers (A-1) to (A-5)

| Graft Polymer | Hydrophobic Monomer | Weight Average Molecular Weight |
|---|---|---|
| (A-1) | Methyl methacrylate | $6.1 \times 10^5$ |
| (A-2) | Ethyl methacrylate | $6.0 \times 10^5$ |
| (A-3) | Styrene | $6.1 \times 10^5$ |
| (A-4) | Vinyl acetate | $6.2 \times 10^5$ |
| (A-5) | t-Butyl methacrylate | $6.0 \times 10^5$ |

<Synthesis of Graft Polymer (B-1) Having Hydrophilic Segment as a Graft Chain>

Synthesis of Hydrophilic Macromer:

N,N-Dimethylacrylamide (40 g) and 3.8 g of 3-mercaptopropionic acid were dissolved in 95 g of ethanol, the temperature was raised to 60° C. under a nitrogen atmosphere, and 300 mg of a thermal polymerization initiator 2,2'-azobisisobutyronitrile (AIBN) was added thereto and the reaction system was allowed to react for 6 hours. After the reaction, a white precipitate was filtered and thoroughly washed, whereby 38.5 g of a prepolymer having carboxylic acids at terminals was obtained (the carboxylic acid value: 0.75 meq/g, the weight average molecular weight: $1.25\times 10^3$).

The obtained prepolymer (20 g) was dissolved in 62 g of N)N-dimethylacetamide, thereto were added 6.71 g of glycidyl methacrylate, 504 mg of N,N-dimethyldodecylamine (a catalyst) and 62.4 mg of hydroquinone (a polymerization inhibitor), and the temperature was raised to 130° C. and the solution was allowed to react for 6 hours. After the reaction, the obtained reaction product was put into acetone to precipitate a polymer, and the polymer was thoroughly washed, whereby 23.4 g of acrylamide macromonomer having methacrylate at terminals was obtained. (The weight average molecular weight: $1.33\times 10^3$). From $^1$H-NMR ($D_2O$) 6.12, 5.70 ppm, the existence of the olefin peak of a methacryloyl group and the reduction of the carboxylic acid value (0.019 meq/g), the introduction of the polymerizable group to the terminals was confirmed. The glass transition temperature of the hydrophilic macromer measured with a differential scanning calorimeter (DSC) (manufactured by Seiko Instruments Inc.) was 90° C.

Synthesis of Graft Polymer:

N,N-Dimethylacetamide (15 g) was put into a flask and the temperature was raised to 60° C. under a nitrogen atmosphere. A solution obtained by dissolving 10 g of the above-obtained macromer, 5 g of methyl methacrylate, and 150 mg of a thermal polymerization initiator 2,2'-azobisisobutyronitrile in 15 g of N,N-dimethylacetamide was dripped to the flask over 2 hours. After completion of dripping, the reaction solution was continuously heated for 6 hours. The product was precipitated and thoroughly washed, whereby 14.5 g of graft polymer (B-1) having a hydrophobic segment as the graft chain was obtained. The weight average molecular weight is shown in Table 1 below.

<Synthesis of Graft Polymers (B-2) to (B-5) Having Hydrophilic Segment as a Graft Chain>

Each of graft polymers (B-2) to (B-5) was synthesized in the same manner as the synthesis of graft polymer (B-1) except that the hydrophobic monomer (methyl methacrylate) in the above synthesis example was changed as shown Table 2 below. The weight average molecular weight of each graft polymer is shown in Table 2.

TABLE 2

Graft Polymers (B-2) to (B-5)

| Graft Polymer | Hydrophobic Monomer | Weight Average Molecular Weight |
|---|---|---|
| (B-2) | Ethyl methacrylate | $1.1 \times 10^5$ |
| (B-3) | Styrene | $1.2 \times 10^5$ |
| (B-4) | Vinyl acetate | $1.2 \times 10^5$ |
| (B-5) | t-Butyl methacrylate | $1.1 \times 10^5$ |

<Synthesis of Comparative Graft Polymer (c-1)>

1-Methoxy-2-propanol (53 g) was put into a flask and the temperature was raised to 60° C. under a nitrogen atmosphere. A solution obtained by dissolving 22 g of methyl methacrylate, 30 g of polyoxyethylene monomethacrylate (Blenmer PEM 1000, manufactured by Nippon Oils and Fats Co., Ltd.), and 250 mg of a thermal polymerization initiator 2,2'-azobisisobutyro-nitrile in 53 g of 1-methoxy-2-propanol was dripped to the flask over 2 hours. After completion of dripping, the reaction solution was continuously heated for 6 hours. The product was precipitated and thoroughly washed, whereby 45 g of comparative graft polymer (C-1) was obtained. (The weight average molecular weight: $1.3\times 10^5$).

<Manufacture of Support>

An aluminum plate having a thickness of 0.3 mm (material JIS A1050) was subjected to degreasing treatment with a 10 wt % sodium aluminate aqueous solution at 50° C. for 30 seconds for removing the rolling oil on the surface, and then the aluminum surface was subjected to brush-graining with three nylon brushes planted with hairs having a hair diameter of 0.3 mm and a suspension of pumice stone and water having a median diameter of 25 μm (the specific gravity: 1.1 g/cm$^3$), and the surface of the plate was thoroughly washed with water. The plate was immersed in a 25% sodium hydroxide aqueous solution at 45° C. for 9 seconds for etching, and then washed with water. After water washing, the plate was further immersed in a 20% nitric acid aqueous solution at 60° C. for 20 seconds, followed by washing with water. The etched amount of the surface by graining was about 3 g/m$^2$.

Electrochemical surface roughening treatment was performed continuously by alternating voltage of 60 Hz. The electrolyte at this time was a 1 wt % nitric acid aqueous solution (containing 0.5 wt % of an aluminum ion) and the liquid temperature was 50° C. As the alternating current electric source waveform, trapezoidal rectangular waveform alternating current was used, the time TP required for the electric current value to reach the peak from 0 was 0.8 msec, the duty ratio was 1/1, and electrochemical surface roughening treatment was performed with a carbon electrode as the counter electrode. Ferrite was used as the auxiliary anode. The electric current density was 30 $A/dm^2$ at a peak value of electric current, and 5% of the electric current from the electric source was diverted to the auxiliary anode. The quantity of electricity in the nitric acid electrolysis was 175 $C/dm^2$ of the quantity of electricity in the case where the aluminum plate was the anode. The aluminum plate was then washed with water by spraying.

Subsequently, electrochemical surface roughening treatment of the aluminum plate was performed in the same manner as in the above nitric acid electrolysis with an electrolyte of a 0.5 wt % hydrochloric acid aqueous solution (containing 0.5 wt % of an aluminum ion) at a liquid temperature of 50° C. on the condition of 50 $C/dm^2$ of the quantity of electricity in the case where the aluminum plate was the anode, and the plate was then washed with water by spraying. The plate was provided with 2.5 $g/m^2$ of a direct current anodic oxide film with a 15% sulfuric acid aqueous solution (containing 0.5 wt % of an aluminum ion) as the electrolyte and the electric current density of 15 $A/dm^2$, washed with water, dried, and further subjected to treatment with a 25 wt % sodium silicate aqueous solution at 30° C. for 10 seconds. The central line average surface roughness (Ra) of the plate measured with a needle having a diameter of 2 μm was 0.51 μm.

Examples 1 to 10 and Comparative Example 1

<Manufacture of Lithographic Printing Plate Precursor>

Image-recording layer coating solution (1) having the composition shown below was coated on the above support with bar coating, and dried in an oven at 100° C. for 60 seconds to form an image-recording layer having a dry coating weight of 1.0 $g/m^2$, whereby lithographic printing plate precursors 1 to 10 and comparative lithographic printing plate precursor 1' were prepared.

Image-recording Layer Coating Solution (1):

| | |
|---|---|
| Infrared absorber (1) shown below | 0.05 g |
| Polymerization initiator (1) shown below | 0.2 g |
| Graft polymer shown in Table 3 below | 0.5 g |
| A polymerizable compound Isocyanuric acid EO-modified triacrylate (NK Ester M-315, manufactured by Shin Nakamura Kagaku Co., Ltd.) | 1.0 g |
| Naphthalene sulfonate of Victoria Pure Blue | 0.02 g |
| Fluorine surfactant (1) shown below | 0.1 g |
| Methyl ethyl ketone | 18.0 g |

Infrared Absorber (1)

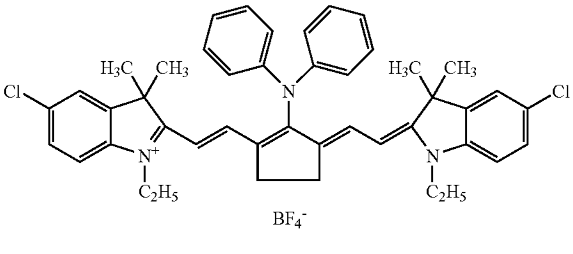

Polymerization Initiator (1)

-continued

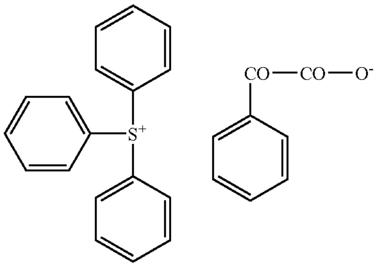

Fluorine Surfactant (1)

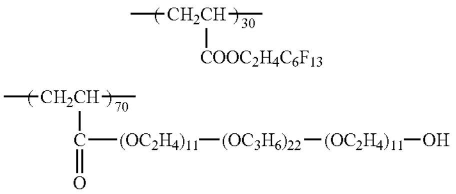

<Exposure and Printing>

Each of the obtained lithographic printing plate precursors was subjected to exposure with Trendsetter 3244VX (manufactured by Creo) loading a water-cooling type 40 W infrared semiconductor laser on the conditions of output of 9 W, external drum rotation speed of 210 rpm, and resolution of 2,400 dpi, so that a fine line chart was contained in the exposed image. The exposed printing plate precursor was mounted on SOR-M cylinder (manufactured by Heidelberg Japan K.K.) without performing development. A fountain solution (EU-3 (an etching solution manufactured by Fuji Photo Film Co., Ltd.)/water/isopropyl alcohol=1/89/10 (by volume)) and TRANS-G (N) sumi ink (manufactured by Dainippon Ink and Chemicals Inc.) were fed as the fountain solution and ink, and printing was performed at a printing speed of 6,000 sheets per hour.

<Evaluation>

In general, in the case of a negative lithographic printing plate precursor, the degree of hardening of an image-recording layer (a photosensitive layer) is low when the exposure amount is small, and the degree of hardening is high when the exposure amount is large. When the degree of hardening of an image-recording layer is too low, the press life of the lithographic printing plate is low and the reproducibility of small dots and fine lines becomes failure. On the other hand, when the degree of hardening of an image-recording layer is high, the press life is high and the reproducibility of small dots and fine lines becomes good.

In the invention, as shown below, the press life and fine line reproducibility of the obtained negative lithographic printing plate precursors 1 to 10 and 1' were evaluated on the same exposure condition as described above and the results of evaluation were taken as the criteria of the sensitivity of each lithographic printing plate precursor. That is, the more the number of printed sheets in the press life, and the finer the fine line width in the fine line reproducibility, the higher is the sensitivity of the lithographic printing plate precursor.

(1) On-press Developing Properties

Printing was started in the same manner as above, after printing 100 sheets of paper, the number of the printed sheets required until the time when the printed sheet having no ink soiling on the non-image area was obtained was counted and this was taken as the number of sheets of on-press development. The fewer the number of sheets, the higher is the evaluation of on-press developing properties.

(2) Fine Line Reproducibility

After 100 sheets of paper were printed as described above and it was confirmed that a printed sheet free from the soiling of ink on the non-image area was obtained, 500 sheets of paper were further printed. The fine line chart (a chart on which 10, 12, 14, 16, 18, 20, 25, 30, 35, 40, 60, 80, 100 and 200 μm fine lines were exposed) of the $600^{th}$ printed sheet was observed with a loupe of 25 magnifications, and fine line reproducibility was evaluated from the fine width reproduced with the ink without cutting. The results obtained are shown in Table 3 below.

(3) Press Life

After performing printing of the evaluation of fine line reproducibility as above, printing was further continued. Since the image-recording layer gradually wore down and ink receptive property lowered as the number of printing increased, the density of ink on the printed sheets lowered. Press life was evaluated by the number of the printed sheets required until the time when the ink density (reflection density) lowered by 0.1 from the starting time of printing. The results obtained are shown in Table 3 below.

TABLE 3

Examples 1 to 10 and Comparative Example 1

| | Graft Polymer | On-Press Developing Properties (number of sheets) | Fine Line Reproducibility (μm) | Press Life (number of sheets) |
|---|---|---|---|---|
| Example 1 | A-1 | 30 | 20 | 9,000 |
| Example 2 | A-2 | 30 | 18 | 8,000 |
| Example 3 | A-3 | 30 | 16 | 9,000 |
| Example 4 | A-4 | 40 | 18 | 10,000 |
| Example 5 | A-5 | 35 | 16 | 11,000 |
| Example 6 | B-1 | 35 | 20 | 8,000 |
| Example 7 | B-2 | 35 | 16 | 7,000 |
| Example 8 | B-3 | 30 | 16 | 9,000 |
| Example 9 | B-4 | 40 | 18 | 8,000 |
| Example 10 | B-5 | 35 | 16 | 9,000 |
| Comparative Example 1 | C-1 | 40 | 30 | 4,000 |

From the above results it can be seen that in Comparative Example 1 using C-1 having a graft chain of polyethylene oxide chains having a low glass transition temperature (Tg: −45° C.), fine line reproducibility and press life are insufficient, although on-press developing properties are good. On the other hand, the lithographic printing plate precursors in the invention using graft polymers of hydrophilic segments having high glass transition temperature are excellent not only in on-press developing properties but also in fine line reproducibility and press life. Accordingly, it can be said that the lithographic printing plate precursors in the invention are also excellent in sensitivity.

Examples 11 to 15 and Comparative Example 2

Image-recording layer coating solution (2) having the composition shown below was coated on the same support as used in Example 1 with bar coating, and dried in an oven at 70° C. for 60 seconds to form an image-recording layer having a dry coating weight of 0.8 g/m$^2$, whereby lithographic printing plate precursors 11 to 15 and comparative lithographic printing plate precursor 2' were prepared.

Image-recording Layer Coating Solution (2):

| | |
|---|---|
| Water | 8 g |
| Propylene glycol monomethyl ether | 10 g |
| Methyl ethyl ketone | 2 g |
| Infrared absorber (2) shown below | 0.03 g |
| Graft polymer shown in Table 4 below | 0.1 g |
| Microcapsule (1) shown below (in terms of solids content) | 1 g |
| Polymerization initiator (1) shown above | 0.1 g |
| Fluorine surfactant (1) shown above | 0.02 g |

Infrared Absorber (2)

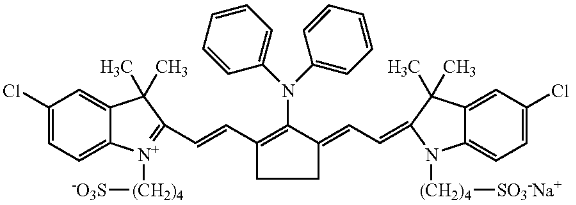

Synthesis of Microcapsule (1):

As the oil phase component, 10 g of the addition product of trimethylolpropane and xylenediisocyanate (Takenate D-110N, manufactured by Mitsui Takeda Chemicals Inc.), 3.5 g of pentaerythritol triacrylate (SR444, manufactured by Nippon Kayaku Co., Ltd.), 1 g of 3-(N,N-diethylamino)-6-methyl-7-anilinofluoran (ODB, manufactured by YAMAMOTO CHEMICALS INC.), and 0.1 g of Pionin A-41C (sodium dodecylbenzenesulfonate, manufactured by Takemoto Oil & Fat) were dissolved in 17 g of ethyl acetate. As the aqueous phase component, 40 g of a 4 wt % aqueous solution of PVA-205 was prepared. The oil phase component and the aqueous phase component were mixed, and emulsified with a homogenizer at 12,000 rpm for 10 minutes. The obtained emulsified product was added to 25 g of distilled water, stirred at room temperature for 30 minutes, and then stirred at 40° C. for 3 hours, The concentration of the solids content of the obtained microcapsule solution was diluted to reach 20 wt % with distilled water. The average particle size was 0.3 μm.

The thus-obtained lithographic printing plate precursors were subjected to exposure and used in printing and evaluated in the same manner as in Example 1. The results obtained are shown in Table 4.

TABLE 4

Examples 11 to 15 and Comparative Example 2

| | Graft Polymer | On-Press Developing Properties (number of sheets) | Fine Line Reproducibility (μm) | Press Life (number of sheets) |
|---|---|---|---|---|
| Example 11 | A-1 | 25 | 20 | 9,000 |
| Example 12 | A-2 | 25 | 18 | 8,000 |
| Example 13 | A-3 | 25 | 16 | 9,000 |
| Example 14 | B-4 | 35 | 18 | 8,000 |
| Example 15 | B-5 | 30 | 16 | 9,000 |
| Comparative Example 2 | C-1 | 35 | 35 | 3,000 |

It can be seen from the above results that in the lithographic printing plate precursors using microcapsules in image recording layers, the lithographic printing plate precursors in the invention are also superior in fine line reproducibility and press life to the lithographic printing plate precursor in Comparative Example 2 using C-1 having polyethylene oxide chain as a graft chain.

<Synthesis of Graft Polymer (A'-1) Having a Graft Chain of Hydrophobic Segment>

Synthesis of Hydrophobic Macromer:

Methyl methacrylate (42 g) and 3.8 g of 3-mercaptopropionic acid were dissolved in 84 g of methyl ethyl ketone, the temperature was raised to 60° C. under a nitrogen atmosphere, and 300 mg of a thermal polymerization initiator 2,2'-azobisisobutyronitrile (AIBN) was added thereto and the reaction system was allowed to react for 6 hours. After the reaction, the obtained reaction product was put into water to precipitate a polymer, the precipitated polymer was filtered and thoroughly washed with water, whereby 43.5 g of a prepolymer having carboxylic acids at terminals was obtained (the carboxylic acid value: 0.75 meq/g, the weight average molecular weight: $1.8\times10^3$).

The obtained prepolymer (20 g) was dissolved in 62 g of N,N-dimethylacetamide, thereto were added 6.71 g of glycidyl methacrylate, 504 mg of N,N-dimethyldodecylamine (a catalyst) and 62.4 mg of hydroquinone (a polymerization inhibitor), and the temperature was raised to 130° C. and the solution was allowed to react for 6 hours. After the reaction, the obtained reaction product was put into water to precipitate a polymer, and the polymer was thoroughly washed, whereby 23.4 g of methyl methacrylate macromonomer having methacrylate at terminals was obtained. (The weight average molecular weight: $8\times10^3$). From $^1$H-NMR ($CDCl_3$) 6.12, 5.70 ppm, the existence of the olefin peak of a methacryloyl group and the reduction of the carboxylic acid value (0.043 meq/g), the introduction of the polymerizable group to the terminals was confirmed.

Synthesis of Graft Polymer (A'-1):

1-Methoxy-2-propanol (15 g) was put into a flask and the temperature was raised to 60° C. under a nitrogen atmosphere. A solution obtained by dissolving 10 g of the above-obtained macromer, 5 g of methacrylamide, and 150 mg of a thermal polymerization initiator 2,2'-azobisisobutyronitrile in 15 g of 1-methoxy-2-propanol was dripped to the flask over 2 hours. After completion of dripping, the reaction solution was continuously heated for 6 hours. The product was precipitated and thoroughly washed, whereby 14.5 g of graft polymer (A'-1) having a hydrophobic segment as the graft chain was obtained. (The weight average molecular weight: $1.30\times10^5$).

<Synthesis of Graft Polymers (A'-2) to (A'-5) Having a Graft Chain of Hydrophobic Segment>

Each of graft polymers (A'-2) to (A'-5) was synthesized by copolymerizing a hydrophobic macromer and a hydrophilic monomer in the same manner as in the synthesis of graft polymer (A'-1) except that the hydrophilic monomer (methacrylamide) used in the synthesis of graft polymer (A'-1) was changed as shown Table 5 below. The weight average molecular weight of each graft polymer is shown in Table 5.

TABLE 5

| Graft Polymer | Hydrophilic Monomer | Weight Average Molecular Weight |
|---|---|---|
| (A'-2) | Methoxy tetraethylene glycol monomethacrylate | $1.50\times10^5$ |
| (A'-3) | Methacrylic acid | $1.30\times10^5$ |
| (A'-4) | N-Isopropylacrylamide | $1.40\times10^5$ |
| (A'-5) | 2-Acrylamide-2-methylpropane sulfonic acid | $1.20\times10^5$ |

Synthesis of Graft Polymer (B'-1) Having a Graft Chain of Hydrophobic Segment>

Synthesis of Hydrophobic Macromer:

Styrene (44 g) and 3.8 g of 3-mercaptopropionic acid were dissolved in 88 g of methyl ethyl ketone, the temperature was raised to 60° C. under a nitrogen atmosphere, and 300 mg of a thermal polymerization initiator 2,2'-azobisisobutyronitrile (AIBN) was added thereto and the reaction system was allowed to react for 6 hours. After the reaction, the obtained reaction product was put into water to precipitate a polymer, and the precipitated polymer was filtered and thoroughly washed, whereby 43.5 g of a prepolymer having carboxylic acids at terminals was obtained (the carboxylic acid value: 0.76 meq/g, the weight average molecular weight: $1.9\times10^3$).

The obtained prepolymer (20 g) was dissolved in 62 g of N,N-dimethylacetamide, thereto were added 6.71 g of glycidyl methacrylate, 504 mg of N,N-dimethyldodecylamine (a catalyst) and 62.4 mg of hydroquinone (a polymerization inhibitor) and the temperature was raised to 130° C. and the solution was allowed to react for 6 hours. After the reaction, the obtained reaction product was put into water to precipitate a polymer, and the polymer was thoroughly washed, whereby 23.4 g of styrene macromonomer having methacrylate at terminals was obtained. (The weight average molecular weight: $1.8\times10^3$). From $^1$H-NMR ($CDCl_3$) 6.12, 5.70 ppm, the existence of the olefin peak of a methacryloyl group and the reduction of the carboxylic acid value (0.041 meq/g), the introduction of the polymerizable group to the terminals was confirmed.

Synthesis of Graft Polymer:

1-Methoxy-2-propanol (15 g) was put into a flask and the temperature was raised to 60° C. under a nitrogen atmosphere. A solution obtained by dissolving 10 g of the above-obtained styrene macromonomer having methacrylate at terminals, 5 g of methacrylamide, and 150 mg of a thermal polymerization initiator 2,2'-azobisisobutyronitrile in 15 g of 1-methoxy-2-propanol was dripped to the flask over 2 hours. After completion of dripping, the reaction solution was continuously heated for 6 hours. The product was precipitated and thoroughly washed, whereby 14.5 g of graft polymer (B'-1) having hydrophobic segment as the graft chain was obtained. (The weight average molecular weight: $1.8\times10^3$).

<Synthesis of Graft Polymers (B'-2) to (B'-5) Having a Graft Chain of Hydrophobic Segment>

Each of graft polymers (B'-2) to (B'-5) was synthesized in the same manner as in the synthesis of graft polymer (B'-1) except that the hydroplilic monomer (methacrylamide) used in the synthesis of graft polymer (B'-1) was changed as shown Table 6 below. The weight average molecular weight of each graft polymer is shown in Table 6.

TABLE 6

| Graft Polymer | Hydrophilic Monomer | Weight Average Molecular Weight |
|---|---|---|
| (B'-2) | Methoxy tetraethylene glycol Monomethacrylate | $1.40 \times 10^5$ |
| (B'-3) | Methacrylic acid | $1.20 \times 10^5$ |
| (B'-4) | N-Isopropylacrylamide | $1.30 \times 10^5$ |
| (B'-5) | 2-Acrylamide-2-methylpropane sulfonic acid | $1.10 \times 10^5$ |

<Synthesis of Comparative Graft Polymer (C'-1)>

1-Methoxy-2-propanol (53 g) was put into a flask and the temperature was raised to 60° C. under a nitrogen atmosphere. A solution obtained by dissolving 22 g of methyl methacrylate, 30 g of polyoxyethylene monomethacrylate (Blenmer PEM 1000, manufactured by Nippon Oils and Fats Co., Ltd.), and 250 mg of a thermal polymerization initiator 2,2'-azobisisobutyro-nitrile in 53 g of 1-methoxy-2-propanol was dripped to the flask over 2 hours. After completion of dripping, the reaction solution was continuously heated for 6 hours. The reaction solution was precipitated and thoroughly washed, whereby 45 g of comparative graft polymer (C'-1) was obtained. (The weight average molecular weight: $1.3 \times 10^5$).

<Manufacture of Support>

An aluminum plate having a thickness of 0.3 mm (material 1050) was subjected to degreasing treatment with a 10 wt % sodium aluminate aqueous solution at 50° C. for 30 seconds for removing the rolling oil of the surface, and then the aluminum surface was subjected to brush-graining with three nylon brushes planted with hairs having a hair diameter of 0.3 mm and a suspension of pumice stone and water of a median diameter of 25 μm (the specific gravity: 1.1 g/cm$^3$), and the surface of the plate was thoroughly washed with water. The plate was immersed in a 25 wt % sodium hydroxide aqueous solution at 45° C. for 9 seconds for etching, and then washed with water. After water washing, the plate was further immersed in a 20 wt % nitric acid aqueous solution at 60° C. for 20 seconds, followed by washing with water. The etched amount of the surface by graining was about 3 g/m$^2$.

Electrochemical surface roughening treatment was performed continuously by alternating voltage of 60 Hz. The electrolyte at this time was an aqueous solution containing 1 wt % of a nitric acid (containing 0.5 wt % of an aluminum ion) and the liquid temperature was 50° C. As the alternating current electric source waveform, trapezoidal rectangular waveform alternating current was used, the time TP required for the electric current value to reach the peak from 0 was 0.8 msec, the duty ratio was 1/1, and electrochemical surface roughening treatment was performed with a carbon electrode as the counter electrode. Ferrite was used as the auxiliary anode. The electric current density was 30 A/dm$^2$ at a peak value of electric current, and 5% of the electric current from the electric source was diverted to the auxiliary anode. The quantity of electricity in the nitric acid electrolysis was 175 C/dm$^2$ of the quantity of electricity in the case where the aluminum plate was the anode. The aluminum plate was then washed with water.

Subsequently, electrochemical surface roughening treatment of the aluminum plate was performed in the same manner as in the above nitric acid electrolysis with an electrolyte containing a 0.5 wt % hydrochloric acid aqueous solution (containing 0.5 wt % of an aluminum ion) at a liquid temperature of 50° C. on the condition of 50 C/dm$^2$ of the quantity of electricity in the case where the aluminum plate was the anode, and the plate was then subjected to spray washing. The plate was provided with 2.5 g/m$^2$ of a direct current anodic oxide film with a 15 wt % sulfuric acid aqueous solution (containing 0.5 wt % of an aluminum ion) as the electrolyte and the electric current density of 15 A/dm$^2$, washed with water, dried, and further subjected to treatment with a 2.5 wt % sodium silicate aqueous solution at 30° C. for 10 seconds. The central line average surface roughness (Ra) of the plate measured with a needle having a diameter of 2 μm was 0.51 μm.

Examples 16 to 25 and Comparative Example 3

<Manufacture of Lithographic Printing Plate Precursor>

Image-recording layer coating solution (3) having the composition shown below was coated on the above support with bar coating, and dried in an oven at 100° C. for 60 seconds to form an image-recording layer having a dry coating weight of 1.0 g/m$^2$, whereby lithographic printing plate precursors 16 to 25 and comparative lithographic printing plate precursor 3' were prepared.

Image-recording Layer Coating Solution (3):

| | |
|---|---|
| Infrared absorber (1) shown above | 0.05 g |
| Polymerization initiator (1) shown above | 0.2 g |
| Graft polymer shown in Table 7 below | 0.5 g |
| A polymerizable compound Isocyanuric acid EO-modified triacrylate (NK Ester M-315, manufactured by Shin Nakamura Kagaku Co., Ltd.) | 1.0 g |
| Naphthalene sulfonate of Victoria Pure Blue | 0.02 g |
| Fluorine surfactant (1) shown above | 0.1 g |
| Methyl ethyl ketone | 18.0 g |

Each of the thus-obtained lithographic printing plate precursors was subjected to exposure and used in printing and evaluated in the same manner as in Example 1. The results obtained are shown in Table 7 below.

TABLE 7

| | Graft Polymer | On-Press Developing Properties (number of sheets) | Fine Line Reproducibility (μm) | Press Life (number of sheets) |
|---|---|---|---|---|
| Example 16 | A'-1 | 40 | 16 | 12,000 |
| Example 17 | A'-2 | 30 | 16 | 10,000 |
| Example 18 | A'-3 | 35 | 20 | 9,000 |
| Example 19 | A'-4 | 40 | 18 | 10,000 |
| Example 20 | A'-5 | 35 | 18 | 10,000 |
| Example 21 | B'-1 | 30 | 16 | 12,000 |
| Example 22 | B'-2 | 35 | 18 | 11,000 |
| Example 23 | B'-3 | 40 | 20 | 9,000 |
| Example 24 | B'-4 | 40 | 18 | 12,000 |
| Example 25 | B'-5 | 35 | 18 | 10,000 |
| Comparative Example 3 | C'-1 | 40 | 30 | 4,000 |

From the above results it can be seen that in Comparative Example 3 using (C'-1) having graft polymers of hydrophilic polyoxyethylene, fine line reproducibility and press life are insufficient, although on-press developing properties are good. On the other hand, the lithographic printing plate precursors in the invention are excellent not only in on-press developing properties but also in fine line reproducibility and press life. Since the lithographic printing plate precursors in the invention are excellent in fine line reproducibility and press life, it can be said that they are also excellent in sensitivity, as described above.

Examples 26 to 30

Image-recording layer coating solution (4) having the composition shown below was coated on the above support with bar coating, and dried in an oven at 70° C. for 60 seconds to form an image-recording layer having a dry coating weight of 0.8 g/$m^2$, whereby lithographic printing plate precursors 26 to 30 and comparative lithographic printing plate precursor 4' were prepared.

Image-recording Layer Coating Solution (4):

| | |
|---|---|
| Water | 8.0 g |
| Propylene glycol monomethyl ether | 10.0 g |
| Methyl ethyl ketone | 2.0 g |
| Infrared absorber (2) shown above | 0.03 g |
| Graft polymer shown in Table 8 below | 0.1 g |
| Microcapsule (1) shown above (in terms of solids content) | 1.0 g |
| Polymerization initiator (1) shown above | 0.1 g |
| Fluorine surfactant (1) shown above | 0.02 g |
| A polymerizable compound Isocyanuric acid EO-modified triacrylate (NK Ester M-315, manufactured by Shin Nakamura Kagaku Co., Ltd.) | 1.0 g |

Each of the thus-obtained lithographic printing plate precursors was subjected to exposure and used in printing and evaluated in the same manner as in Example 16. The results obtained are shown in Table 8 below.

TABLE 8

| Examples 26 to 30 | | | | |
|---|---|---|---|---|
| | Graft Polymer | On-Press Developing Properties (number of sheets) | Fine Line Reproducibility (μm) | Press Life (number of sheets) |
| Example 26 | A'-1 | 35 | 16 | 12,000 |
| Example 27 | A'-2 | 25 | 16 | 10,000 |
| Example 28 | A'-3 | 30 | 20 | 9,000 |
| Example 29 | B'-4 | 35 | 20 | 12,000 |
| Example 30 | B'-5 | 30 | 18 | 10,000 |

The above results show that in the case where microcapsules encapsulating a polymerizable compound are used in image recording layers, the lithographic printing plate precursors in the invention are excellent not only in on-press developing properties but also in fine line reproducibility and press life.

This application is based on Japanese patent applications JP 2003-432322, filed on Dec. 26, 2004 and JP 2004-010320, filed on Jan. 19, 2004, the entire content of which is hereby incorporated by reference, the same as if set forth at length.

What is claimed is:

1. A lithographic printing plate precursor comprising:

a support; and an image recording layer capable of being removed by a printing ink and/or a fountain solution, in which the image recording layer comprises:

an infrared absorber;

a microcapsule;

an addition polymerizable compound having at least one terminal ethylenically unsaturated bond, said polymerizable compound being located outside of the microcapsule; and a graft polymer having a graft chain containing a hydrophilic segment, wherein the hydrophilic segment is a polymer containing at least one monomer unit selected from the group consisting of an amido group-containing monomer, an acid group-containing monomer, an alkali metal salt of an acid group-containing monomer, a quaternary ammonium salt-containing monomer and a hydroxyl group-containing monomer in proportion of 50 mol % or more, wherein said image recording layer is formed directly on said support or is formed directly on a heat-insulating undercoating layer formed directly on said support.

2. The lithographic printing plate precursor as claimed in claim 1, wherein the image-recording layer contains a polymerization initiator.

3. A lithographic printing method, which comprises: mounting the lithographic printing plate precursor as claimed in claim 1 on a printing press; and then imagewise exposing the lithographic printing plate precursor with an infrared laser beam; providing the lithographic printing plate precursor with an oily ink and an aqueous component to remove the unexposed area with the infrared ray of the image recording layer; and performing a printing.

4. A lithographic printing method, which comprises: imagewise exposing the lithographic printing plate precursor as claimed in claim 1 with an infrared laser beam; and then mounting the lithographic printing plate precursor on a printing press; providing the lithographic printing plate precursor with an oily ink and an aqueous component to remove the unexposed area with the infrared ray of the image recording layer; and performing a printing.

5. A lithographic printing plate precursor comprising: a support; and an image recording layer, wherein the image recording layer comprises an infrared absorber and a graft polymer having a hydrophilic main chain and a graft chain containing a hydrophobic segment.

6. The lithographic printing plate precursor as claimed in claim 5, wherein the image-recording layer contains a polymerization initiator and a polymerizable compound.

7. The lithographic printing plate precursor as claimed in claim 5, wherein the image-recording layer is capable of being removed by a printing ink and/or a fountain solution.

8. A lithographic printing method, which comprises: mounting the lithographic printing plate precursor as claimed in claim 5 on a printing press; and then imagewise exposing the lithographic printing plate precursor with an infrared laser beam; providing the lithographic printing plate precursor with an oily ink and an aqueous component to remove the unexposed area with the infrared ray of the image recording layer; and performing a printing.

9. A lithographic printing method, which comprises: imagewise exposing the lithographic printing plate precursor as claimed in claim 5 with an infrared laser beam; and then mounting the lithographic printing plate precursor on a printing press; providing the lithographic printing plate precursor with an oily ink and an aqueous component to remove the unexposed area with the infrared ray of the image recording layer; and performing a printing.

* * * * *